(12) United States Patent
Oh et al.

(10) Patent No.: US 7,900,165 B2
(45) Date of Patent: Mar. 1, 2011

(54) DETERMINING A DESIGN ATTRIBUTE BY ESTIMATION AND BY CALIBRATION OF ESTIMATED VALUE

(75) Inventors: Nahmsuk Oh, Goleta, CA (US);
Peivand Fallah-Tehrani, Camarillo, CA (US); Alireza Kasnavi, Sunnyvale, CA (US); Subramanyam Sripada, Hillsboro, OR (US)

(73) Assignee: Synopsys, Inc., Mountain View, CA (US)

( * ) Notice: Subject to any disclaimer, the term of this patent is extended or adjusted under 35 U.S.C. 154(b) by 1005 days.

(21) Appl. No.: 11/731,565

(22) Filed: Mar. 30, 2007

(65) Prior Publication Data

US 2008/0243414 A1 Oct. 2, 2008

(51) Int. Cl.
*G06F 17/50* (2006.01)
*G06F 9/45* (2006.01)
*G06F 17/10* (2006.01)

(52) U.S. Cl. .............. 716/4; 716/1; 716/2; 716/5; 716/6; 703/2; 703/14; 703/19

(58) Field of Classification Search .................. 716/1, 2, 716/4, 5, 6, 19, 21; 703/2, 14, 19
See application file for complete search history.

(56) References Cited

U.S. PATENT DOCUMENTS

| | | | | | |
|---|---|---|---|---|---|
| 6,090,152 | A | * | 7/2000 | Hayes et al. ....................... | 716/6 |
| 6,134,707 | A | * | 10/2000 | Herrmann et al. ............. | 717/139 |
| 6,330,523 | B1 | * | 12/2001 | Kacyra et al. ................. | 702/159 |
| 6,810,482 | B1 | * | 10/2004 | Saxena et al. ................. | 713/320 |
| 7,062,733 | B1 | * | 6/2006 | Poskatcheev et al. ............ | 716/6 |
| 7,111,261 | B2 | | 9/2006 | Jones ................................. | 716/6 |
| 7,194,559 | B2 | * | 3/2007 | Salmon et al. ..................... | 710/8 |
| 7,222,036 | B1 | * | 5/2007 | Thorne ........................... | 702/79 |
| 7,262,831 | B2 | * | 8/2007 | Akhssay et al. ................. | 355/52 |
| 7,383,521 | B2 | * | 6/2008 | Smith et al. ...................... | 716/6 |
| 7,576,569 | B2 | * | 8/2009 | Carpenter et al. .............. | 327/14 |
| 7,712,056 | B2 | * | 5/2010 | White et al. ..................... | 716/4 |
| 7,716,616 | B2 | * | 5/2010 | Foreman et al. .................. | 716/6 |
| 2004/0002844 | A1 | * | 1/2004 | Jess et al. ......................... | 703/14 |
| 2005/0278671 | A1 | | 12/2005 | Verghese .......................... | 716/6 |

OTHER PUBLICATIONS

Nassif, S. "Delay variability: sources, impact and trends," ISSCC 2000, 368-369, pp. 2.
Rubinstein, J. et al., "Signal Delay in RC Tree Networks", IEEE Trans. On Computer-Aided Design, Jul. 1983, 202-211, vol. CAD-2, No. 3, pp. 10.

(Continued)

*Primary Examiner* — Helen Rossoshek
(74) *Attorney, Agent, or Firm* — Silicon Valley Patent Group LLP; Omkar Suryadevara

(57) ABSTRACT

A computer-implemented method of determining an attribute of a circuit includes using a computationally expensive technique to simulate the attribute (such as timing delay or slew) of a portion of the circuit, at predetermined values of various parameters (e.g. nominal values of channel length or metal width), to obtain at least a first value of the attribute. The method also uses a computationally inexpensive technique to estimate the same attribute, thereby to obtain at least a second value which is less accurate than the first value. Then the computationally inexpensive technique is repeatedly used on other values of the parameter(s), to obtain a number of additional second values of the attribute. Applying to the additional second values, a function obtained by calibrating the at least one second value to the at least one first value, can yield calibrated estimates very quickly, which represent the attribute's variation relatively accurately.

18 Claims, 10 Drawing Sheets

OTHER PUBLICATIONS

Alpert, C.J. et al., "RC delay metric for performance optimization", IEEE Trans. On CAD, 2001, 571-582, vol. 20, No. 5, pp. 12.

Abou-Seido, I. et al., "Fitted Elmore Delay: A simple and Accurate Interconnect delay model", IEEE Trans. On VLSI, 2004, 691-696, vol. 12, No. 7, pp. 6.

Agarwal, K. et al., "Statistical Interconnect Metric for Physical-Design Optimization", IEEE Trans. On CAD, 2006, 1273-1288, vol. 25, No. 7, pp. 16.

Dartu, F. et al., "Perfomance Computation for Precharacterized CMOS Gates with RC-loads", IEEE Transaction on CAD, May 1996, 544-555, vol. 15, pp. 10.

Hanchate, N. et al., "A Linear Time Algorithm for Wire Sizing with Simultaneous Optimization of Interconnect Delay and Crosstalk Noise", Proceedings of the 19th International Conference on VLSI Design, (VLSID'06), 2006, 283-290, 8 pgs.

Alpert, C.J. et al., "Buffer Insertion for Noise and Delay Optimization", IEEE Transactions on computer-aided design of integrated circuits and systems, Nov. 1999, 1633-1645, vol. 18, No. 11, 13 pgs.

Jiang, I. H-R. et al., "Crosstalk-Driven Interconnect Optimization by Simultaneous Gate and Wire Sizing", IEEE Transactions on computer-aided design of integrated circuits and systems, Sep. 2000, 999-1010, vol. 19, No. 9, 12 pgs.

Vittal, A. et al., "Crosstalk Reduction for VLSI", IEEE Transactions on computer-aided design of integrated circuits and systems, Mar. 1997, 290-298, vol. 16, No. 3, 9 pgs.

Saxena, P. et al., "A Postprocessing Algorithm for Crosstalk-Driven Wire Perturbation", IEEE Transactions on computer-aided design of integrated circuits and systems, Jun. 2000, 691-102, vol. 19, No. 6, 12 pgs.

Becer, M.R. et al., "Postroute Gate Sizing for Crosstalk Noise Reduction", IEEE Transactions on computer-aided design of integrated circuits and systems, Dec. 2004, 1670-1677, vol. 23, No. 12, 8 pgs.

Odabasioglu, A. et al., "PRIMA: Passive Reduced-Order Interconnect Macromodeling Algorithm", IEEE Transactions on computer-aided design of integrated circuits and systems, Aug. 1998, 645-654, vol. 17, No. 8, 10 pgs.

Zhou, H. et al., "Global Routing with Crosstalk Constrains", IEEE Transactions on computer-aided design of integrated circuits and systems, Nov. 1999, 1683-1688, vol. 18, No. 11, 6 pgs.

Xiao, T. et al., "Gate Sizing to Eliminate Crosstalk Induced Timing Violation", Proceedings of the International Conference on Computer Design: VLSI in Computers and Processors (ICCD'01), 2001, 186-191, 6 pgs.

Chen, C-P. et al., "Noise-aware Repeater Insertion and Wire Sizing for On-chip Interconnect Using Hierarchical Moment-Matching", $36^{th}$ Annual Conference on Design Automation (DAC'99), 1999, 502-506, 5 pgs.

Bai, X. et al., "Noise-Aware Driver Modeling for Nanometer Technology", Fourth International Symposium on Quality Electronic Design, 2003, 6 pgs.

Shepard, K.L. "Design Methodologies for Noise in Digital Integrated Circuits", $35^{th}$ Design Automation Conference, 1998, 6 pgs.

Shepard, K.L. et al., "Harmony: Static Noise Analysis of Deep Submicron Digital Integrated Circuits", IEEE Transactions on computer-aided design of integrated circuits and systems, Aug. 1999, 1132-1150, vol. 18, No. 8, 19 pgs.

Guardiani, C. et al., "Modeling the Effect of Wire Resistance in Deep Submicron Coupled Interconnects for Accurate Crosstalk Based Net Sorting", Proc. of PATMOS, Oct. 1998, 287-296, (Advanced Research, Central R&D, DAIS, STMicroelectronics, via C. Olivetti, 2, I-20041 Agrate B., (MI), Italy), 10 pgs.

Pandini, D. et al., "Network Reduction for Crosstalk Analysis in Deep Submicron Technologies", International Workshop on Timing Issues, 1997, (Advanced Research, SGS-Thomson Microelectronics, via C. Olivetti 2, 20041 Agrate Brianza, Italy), 10 pgs.

Entire Prosecution History of U.S. Appl. No. 11/599,145, filed Nov. 14, 2006 by Edhi Sutjahjo et al.

Entire Prosecution History of U.S. Appl. No. 11/644,563, filed Dec. 21, 2006 by Kayhan Kucukcakar et al.

Entire Prosecution History of U.S. Appl. No. 11/525,578, filed Sep. 22, 2006 by Nahmsuk Oh et al.

"Statistical Delay Calculation, A Linear Time Model" by Michel Berkelaar, Proceedings of TAU'97, Austin, TX, Dec. 4-5, 1997, pp. 15-24.

Jess, J. A., Kalafala, K., Naidu, S. R., Otten, R. H., and Visweswariah, C. 2003. Statistical timing for parametric yield prediction of digital integrated circuits. *Proceedings of the 40th Conference on Design Automation* (Anaheim, CA, USA, Jun. 2-6, 2003). DAC 2003. ACM Press, New York, NY, 932-937.

V. Khandelwal, A. Srivastava. A General Framework for Accurate Statistical Timing Analysis Considering Correlations. DAC, 2005. *Proceedings of the 42nd Annual Conference on Design Automation* (San Diego, California, USA, Jun. 13-17, 2005). ACM Press, New York, NY, 89-94.

Li, X., Le, J., and Pileggi, L. T. 2006. Projection-based statistical analysis of full-chip leakage power with non-log-normal distributions. In *Proceedings of the 43rd Annual Conference on Design Automation* (San Francisco, CA, USA, Jul. 24-28, 2006). DAC '06. ACM Press, New York, NY, 103-108.

Datasheet, Signalstorm NDC, by Cadence, 2004.

Rao, R., Srivastava, A., Blaauw, D., and Sylvester, D. 2003. Statistical estimation of leakage current considering inter- and intra-die process variation. In *Proceedings of the 2003 international Symposium on Low Power Electronics and Design* (Seoul, Korea, Aug. 25-27, 2003). ISLPED '03. ACM Press, New York, NY, 84-89.

Ashish, S. et al. "Statistical Analysis and Optimization for VLSI: Timing and Power", 2005, Springer, pp. 1-11; 14-24; 80-88; 114-118.

Elmore, W.C. "The Transient Response of Damped Linear Networks with Particular Regard to Wideband Amplifiers", Journal of Applied Physics, vol. 19, Jan. 1948, pp. 55-63.

* cited by examiner

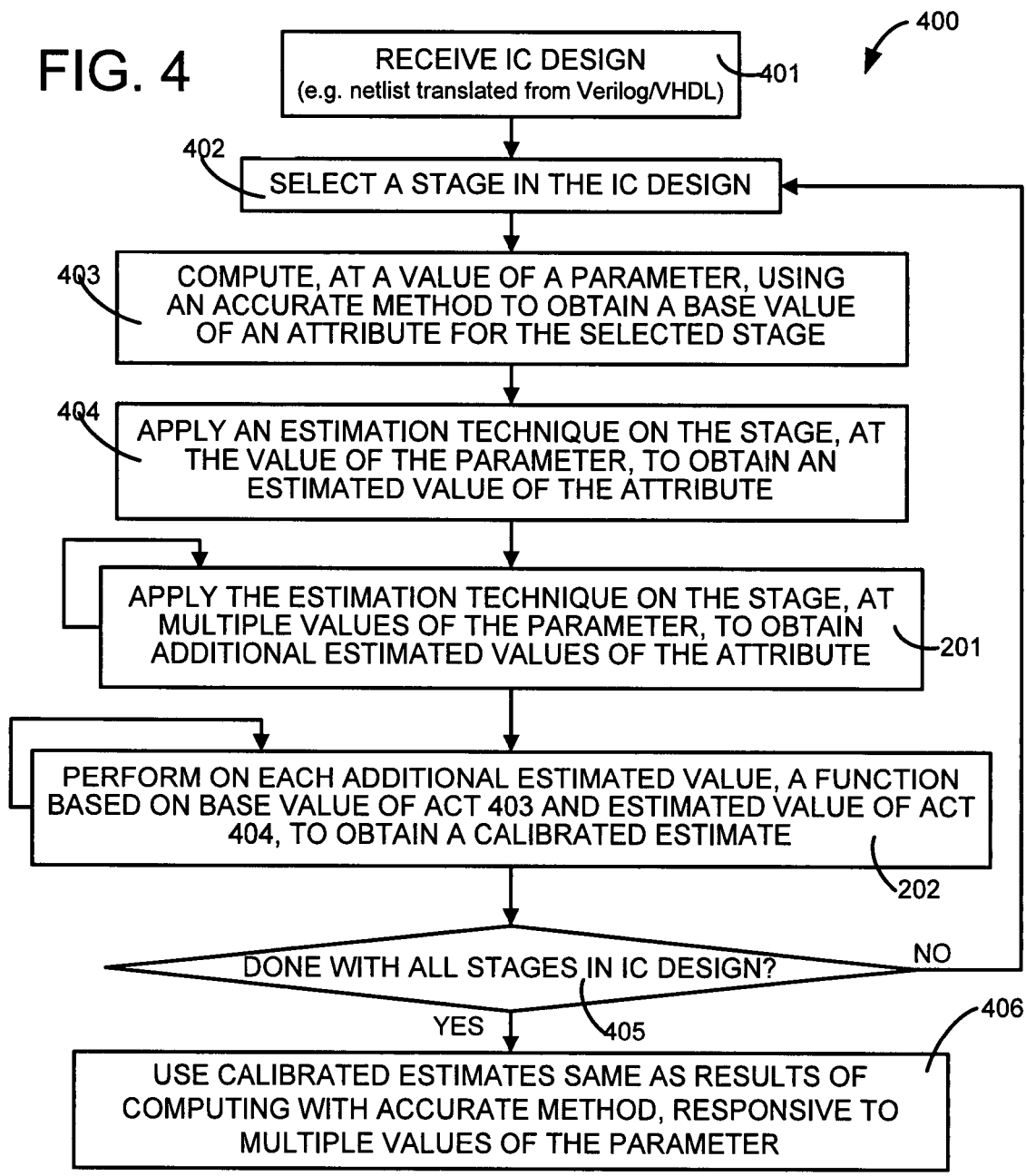
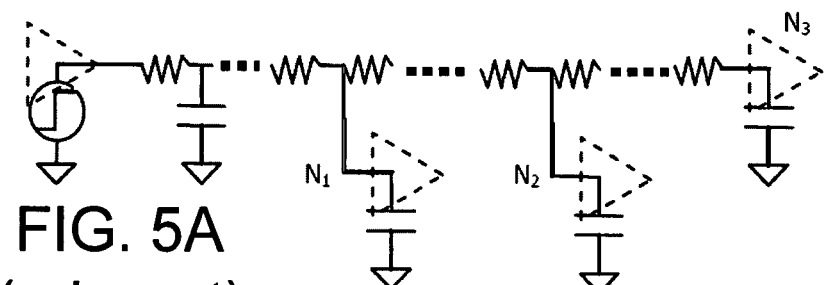
FIG. 5A (prior art)

DETERMINING A DESIGN ATTRIBUTE BY ESTIMATION AND BY CALIBRATION OF ESTIMATED VALUE

CROSS-REFERENCE TO RELATED APPLICATIONS

This application is related to and incorporates by reference herein in its entirety, U.S. application Ser. No. 11/599,145 filed on Nov. 14, 2006 by Edhi Sutjahjo et al, entitled "Method and Apparatus for Facilitating Variation-Aware Parasitic Extraction."

This application is also related to and incorporates by reference herein in its entirety, U.S. application Ser. No. 11/644,563 filed on Dec. 21, 2006 by Kayhan Kucukcakar et al, entitled "Method And Apparatus For Determining The Performance Of An Integrated Circuit."

This application is also related to and incorporates by reference herein in its entirety, U.S. application Ser. No. 11/525,578 filed on Sep. 22, 2006 by Nahmsuk Oh et al, entitled "Generation of Engineering Change Order (ECO) Constraints For Use In Selecting ECO Repair Techniques."

BACKGROUND

1. Field of the Invention

The invention relates to designing an integrated circuit (IC). More specifically, the invention relates to a method and an apparatus to determine an attribute (which is a design-dependent property) of a portion of a circuit that is affected by changes in one or more parameters resulting from an IC fabrication process (also called "variation" parameters).

2. Related Art

Monte Carlo simulation is a well-known technique of solving any statistical analysis problem such as understanding statistical behavior of an integrated circuit subjected to variation. This technique involves applying random or pseudo-random samples and measures the circuit response to all these samples which allows generation of a statistical representation of the circuit behavior as subjected to variation. See Ashish Srivastava et al, "Statistical Analysis and Optimization for VLSI: Timing and Power", Springer ISBN 0-387-25738-1. Monte Carlo based techniques are often used as golden results to gauge the accuracy of other approaches. Advantages of Monte Carlo over other techniques are that it is able to handle any non-linear function; there aren't any limitations on the number of variables that Monte Carlo can simulate, and Monte Carlo automatically preserves the correlation among variation parameters.

A variation parameter is a property of an integrated circuit (IC) which changes depending on the fabrication process used to fabricate the IC. Even if the design of the IC is different, the variation parameter can be the same, if the same fabrication process is used. Illustrative examples of the variation parameter include (but are not limited to): channel length, threshold voltage, metal width, metal thickness, dielectric thickness, via resistance, sheet resistivity or PCA (Principal Component Analysis) parameters; where PCA parameters are a smaller set of parameters abstracted out of the physical parameters for the purpose of reducing the number of parameters involved and identifying the major sources of variation. Depending on the effect of these variation parameters they could also be categorized as net parasitics variation, driver cell variation, load cell variation and input slew variation.

An attribute of an integrated circuit is a property which changes depending on the design of the IC. Illustrative examples of attribute include but are not limited to cell delay, cell slew (transition time), net delay, net slew, crosstalk delay, crosstalk slew, arrival windows, timing slack, total net capacitance, total net resistance, effective capacitance, drive resistance, dynamic power, total power, internal power and leakage power.

On chip variational analysis has become more important as the effects of process variation on timing has increased. See S. Nassif, "Delay variability: sources, impact and trends," ISSCC 2000, pp. 368-369. Process variation occurs in a highly multi-dimensional space. The current inventors note that even without considering intra-die variations, if there are N routing layers, there are at least $4^N$ sources of variation. Thus, even in the most simplified model, not considering intra-die and inter-chip variations, tens of variations have to be considered.

Different variation sources that the current inventors believe should be considered for a stage delay computation are shown in FIG. 1 (prior art). A stage consists of one driver cell and a single interconnect that connects the driver cell to one or more load cells. Note that the load cells after the interconnect are not included in the definition of a stage (as they are included in the next stage). Accordingly, a stage delay does not include delay that occurs entirely within load cells. Instead, in addition to delay within components of a stage, the stage delay includes only the effect of load cells on the aforementioned stage delay. A cell delay is defined as the delay from the input to the output of the driver cell. An interconnect delay is defined as the delay from the output of a driver to the input of a load cell. A stage delay is defined as the addition of a driver cell delay and the interconnect delay.

The current inventors believe that a complete variational analysis should consider different variation sources on driver/load cells 101, 103, cell interconnect 102 and transition time of input signal 104 at the driver cell as shown in FIG. 1. All variation sources have their own probability distributions. In practical designs, these distributions could be of any shape such as normals or lognormals but they are not necessarily limited to Gaussian distributions. The current inventors note that Monte Carlo simulation can handle arbitrary distributions by choosing values from each distribution and running simulations with them. With a sufficiently large number of trial runs, probability distributions of cell delays or interconnect delays can be obtained, for use in IC design validation prior to fabrication.

Many researchers have developed techniques to simplify such analyses by assuming certain characteristics, such as Gaussian distribution for variation sources, or ignoring second order effects by using linear circuit assumptions. Hence, Monte Carlo appears to be a useful technique for analyzing chip devices and interconnects process variation, but its biggest disadvantage is its performance because it requires a large number of trial runs. As a stochastic technique, the error associated to Monte Carlo simulation scales with $1/\sqrt{M}$ where M is the number of trials (or samples). When using computers available to today's IC designers, it seems almost impossible to run such a large number of circuit simulations (e.g. using SPICE) in today's multi-million net designs. Accordingly the current inventors have found a need to improve the speed of Monte Carlo simulation while retaining accuracy.

SUMMARY

A computer-implemented method in accordance with the invention repeatedly applies a technique ("estimation technique") to a portion of a design of an integrated circuit (IC), in order to estimate values ("estimated values") of an attribute (such as timing delay), and also repeatedly performs a function ("calibration function") on the estimated values to obtain more accurate values ("calibrated estimates") of the attribute.

The calibration function in several embodiments of the invention is automatically determined based on one or a few additional estimated value(s) of the attribute and one or a few values ("base values") of the attribute that are more accurate than the additional estimated value(s). The base value(s) of the design attribute are automatically computed in some embodiments by using a method ("base value calculation") that is known to be more accurate than the estimation technique. In some embodiments, the base value calculation is computationally more expensive than the estimation technique, but in these embodiments the base value calculation is used less often than the estimation technique.

Accuracy of calibrated estimates of a design attribute that are obtained by use of the calibration function depends on (i.e. is a function of) the number of base values that are used in determining the calibration function (e.g. a multi point calibration using multiple base values is more accurate than a single point calibration using a single base value). The accuracy of the calibrated estimates also depends on the estimation technique that in turn depends on the attribute itself (e.g. cell delay, effective capacitance). An appropriate combination of estimation techniques and calibration functions yields calibrated estimates that are sufficiently accurate (relative to base values) for several applications.

Hence, calibrated estimates of many attributes (such as delay or slew) are created and stored in memory of a computer, for use in several applications (such as timing analysis, noise analysis, and power analysis) in place of corresponding base values that would otherwise have to be computed. Hence, use of a base value calculation is replaced in accordance with the invention, by a corresponding use of an estimation technique and by a corresponding use of a calibration function, either or both of which are computationally inexpensive, relative to the base value calculation.

Increase in computational speed and/or decrease in memory usage that is realized in each embodiment (relative to base value calculation) depends on the selected combination of estimation technique and calibration function, either or both of which can provide one or more orders of magnitude increase in speed, with a loss in accuracy that is acceptable in some applications, to obtain the speedup.

BRIEF DESCRIPTION OF THE DRAWINGS

FIG. 4 illustrates in a low-level flow chart, a method performed by the computer of FIG. 7A to generate calibrated estimates in some embodiments of the invention.

FIGS. 5A, 5B, and 10 show portions of a prior art IC design with different configurations of interconnect(s) and load cell(s) relative to a driver cell.

DETAILED DESCRIPTION

A computer 150 (FIG. 7A) is programmed in several illustrative embodiments of the invention to automatically determine an attribute (which is design dependent) of a portion of an integrated circuit (e.g. a single stage illustrated in FIG. 1 or a series of stages illustrated in FIG. 10) by applying an estimation technique on the circuit portion (see act 201 in FIG. 2) to obtain an estimated value of the design attribute. The estimation technique is applied repeatedly (as shown by branch 201R) for different values of a variation parameter (such as interconnect resistance), to obtain a corresponding number N of estimated values of the design attribute (such as delay).

Computer 150 (FIG. 7A) is further programmed to modify each estimated value (as per act 202 and branch 202R in FIG. 2) by using a calibration function, to obtain a calibrated estimate for the attribute. Note that N calibrated estimates are obtained in this manner by computer 150 (FIG. 7A), one for each of the N estimated values. The N calibrated estimates are stored in memory (such as a cache and/or a main memory and/or a hard disk) of computer 150 and they are used, in some applications in accordance with the invention, to avoid computation of more accurate values by use of a method (such as SPICE) that is known to be more accurate than the estimation technique. In some embodiments, as illustrated in FIG. 7A, the calibrated estimates are used by a static timing and noise analysis tool 995, for example to determine a timing critical net.

Figure 2:
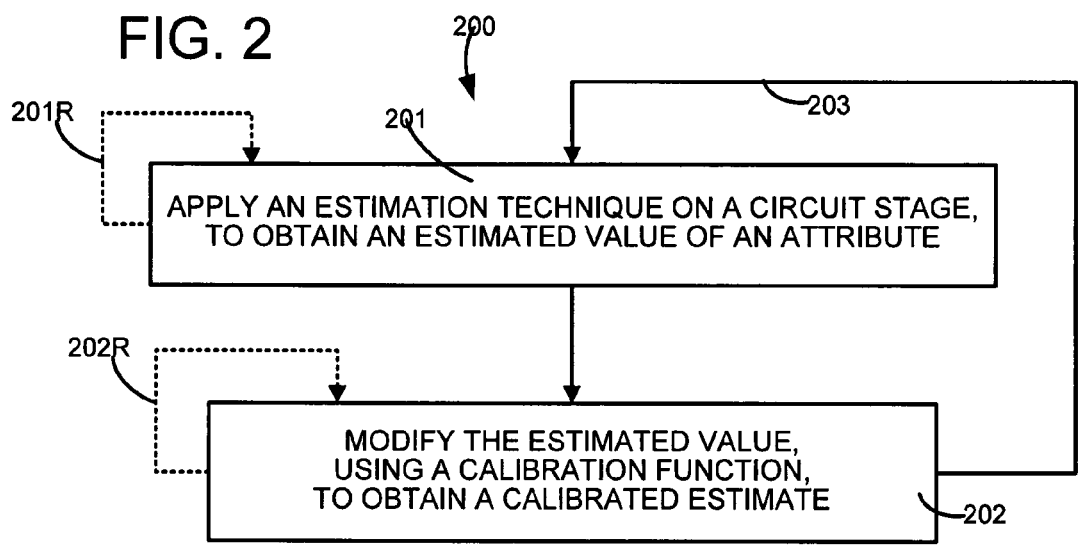
FIG. 2 illustrates, in a high-level flow chart, a method in accordance with the invention, to perform estimation and calibration to automatically determine variation in an attribute (or property or characteristic) of an integrated circuit.

Referring to FIG. 2, some embodiments perform repetition via branches 201R and 202R just once for each variation parameter, e.g. to cover corner cases (e.g. maximum resistance and/or minimum resistance of interconnect). However, repetition via branches 201R and 202R may be performed any number of times, depending on the embodiment. Also depending on the embodiment, during each repetition via branches 201R and 202R, the variation parameter whose value is changed can be same or different. For example, some embodiments implement Monte Carlo simulation, wherein branches 201R and 202R are performed several thousand times or even tens of thousands of times.

Figure 7A:
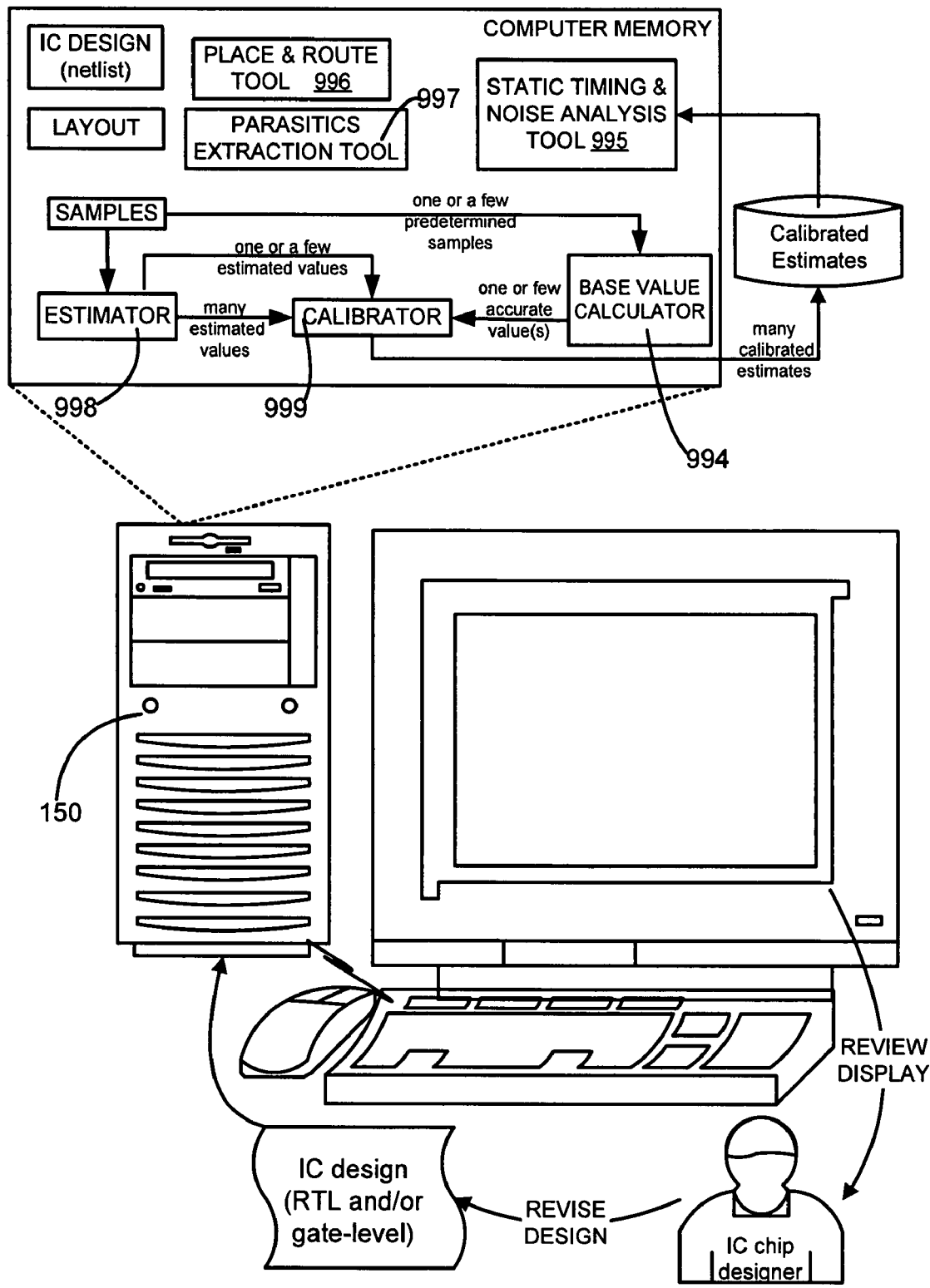
FIGS. 7A and 7B illustrate, in block diagrams, alternative embodiments of a computer that is programmed in accordance with the invention.

Act 201 and branch 201R are implemented in some embodiments by logic implemented in software that when executed by a computer is referred to as "estimator" 998, as shown in FIG. 7A. In these embodiments, act 202 and branch 202R are implemented by another piece of software that when executed by the computer is called "calibrator" 999, also shown in FIG. 7A. Estimator 998 receives any number of samples as input, and generates a corresponding number of estimated values, by performing acts 201 and 201R as noted above.

Calibrator 999 (FIG. 7A), however, does not execute act 202 and branch 202R for any given attribute, until it has been initialized for that attribute by one pair of values, or a few pairs of values (typically less than 10 pairs, more commonly no more than 2 pairs or 3 pairs), depending on the attribute. Each pair of values that is used in such initialization is derived from a predetermined sample (such as a sample of nominal values), with one value in the pair being an estimated value from estimator 998 and another value in the pair being more accurate than the estimated value. The more accurate value, hereinafter base value, is received by calibrator 999 from a base value calculator 994.

Base value calculator 994 is implemented in some embodiments by a circuit simulator such as SPICE or by implementation of other accurate methods used in delay calculation performed in static timing analysis and delay calculation tools such as PrimeTime® offered from Synopsys or Signal-Storm® NDC and Encounter Timing System offered by Cadence. After such initialization, calibrator 999 generates as many calibrated estimates (e.g. N), as the estimated values supplied by estimator 998 (e.g. also N). Hence, a computer 150 when programmed with software pieces 998 and 999 eliminates the need to use a circuit simulator (which is slow) for each and every sample.

Estimator 998 and calibrator 999 of some embodiments are tightly coupled to one another to ensure efficient transfer of data there between, while in other embodiments these two software pieces 998 and 999 are integrated together into a single piece of software. Moreover, these two software pieces 998 and 999 may be tightly coupled to or integrated into a static timing analysis tool 995, depending on the embodiment. Furthermore, in some embodiments, the samples which are input to estimator 998 are received from a sample generation module which is present inside a timing analysis tool. More specifically, the sample-generation module of these embodiments is configured to generate samples of the IC, wherein for a given sample, sample-generation module is configured to use probability distribution to assign values to parameters for components within a circuit. For more details, see, for example, various modules of PrimeTime 708 described in reference to FIG. 7B of U.S. application Ser. No. 11/644,563 referenced above.

Figure 7B:
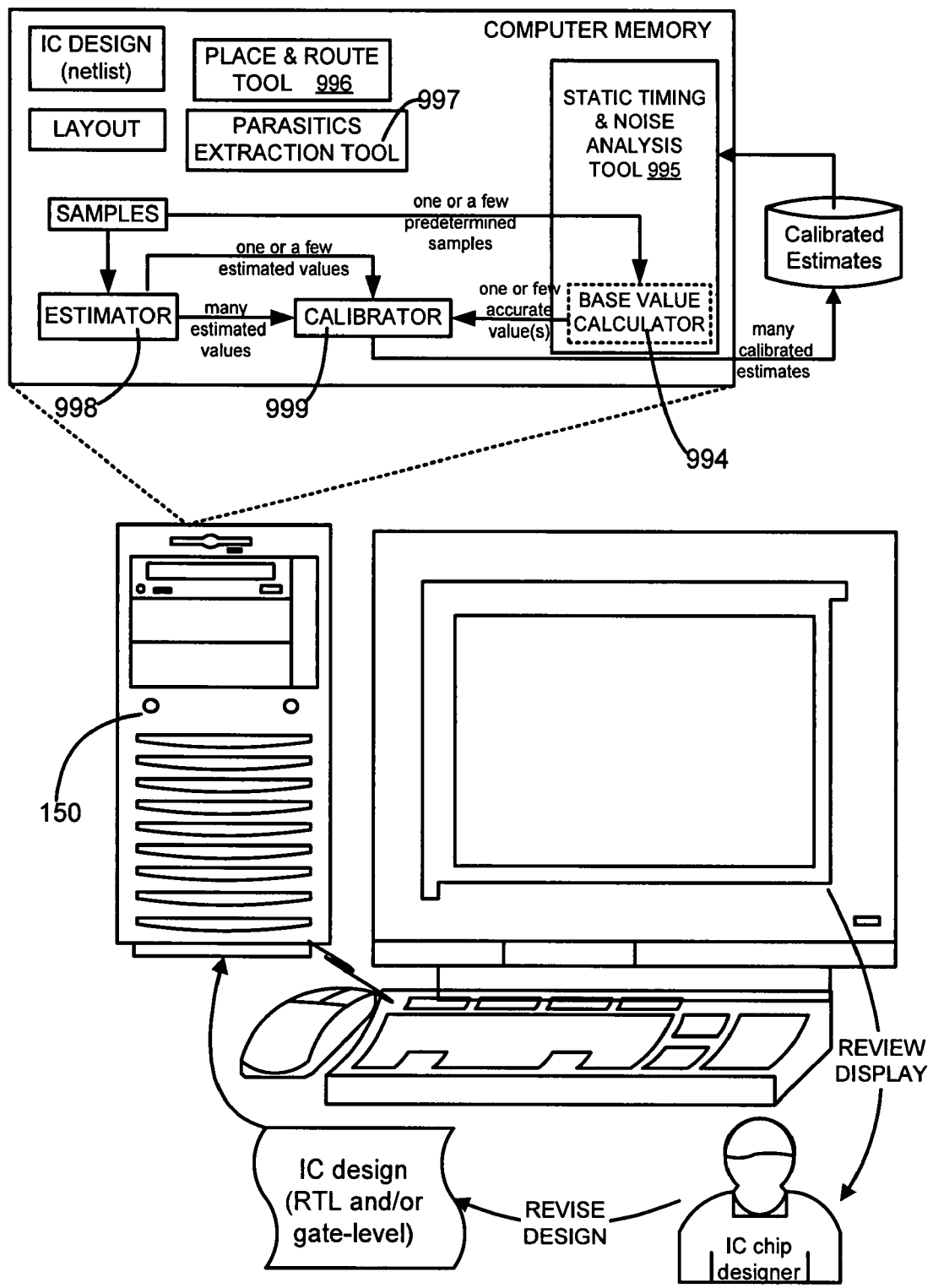

Referring to FIG. 7B of the current patent application, illustrated therein is an embodiment wherein calibrator 999 is coupled to static timing and noise analysis tool 994 to receive therefrom one or more base values. In the embodiment of FIG. 7B, the base values are generated in tool 995, by a delay calculator integrated therein that is used in this embodiment as base value calculator 994.

Note that in some embodiments of the invention, a computer is not programmed with five separate software pieces 995, 996, 997, 998 and 999, and instead all of them are merged into a single tool that performs a place and route operation, a parasitic extraction operation, a static timing & noise analysis operation in a single computer. The just-described tool, of some embodiments also includes functionality to perform circuit simulation or other accurate method for computing base values. Numerous such embodiments will be apparent to the skilled artisan in view of this disclosure.

Referring to FIG. 2, certain embodiments do not perform acts 201 and 202 separately, and instead perform the pair of acts 201 and 202 together, e.g. successively one after another or integrally in a single operation. After acts 201 and 202 are performed together, computer 150 of these embodiments then repeats performance of acts 201 and 202 together, for a given stage of the integrated circuit, on any number of sets of variation parameter values, as shown via branch 203. Note that branch 203 also denotes repeatedly performing acts 201 and 202, for each of a number of stages in the integrated circuit, regardless of whether acts 201 and 202 are performed together or separately.

Figure 3A:
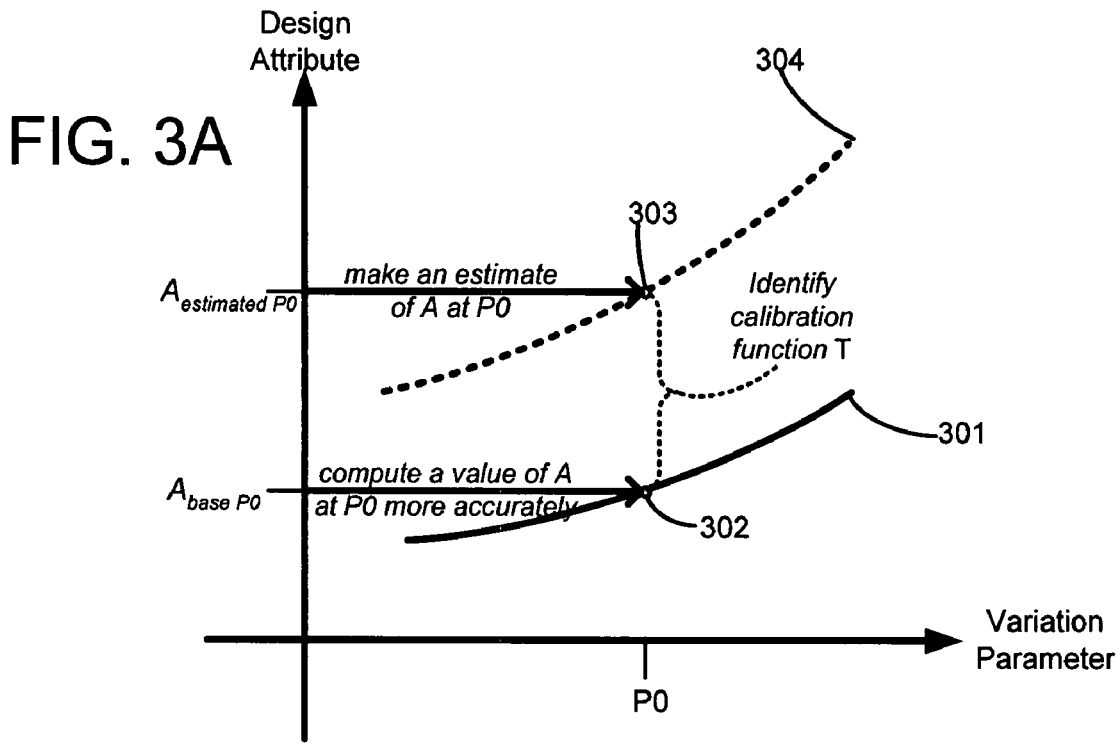
FIGS. 3A-3C illustrate, in graphs, performance of the method of FIG. 2, in one illustrative embodiment of the invention, with effective capacitance as the attribute.
Figure 3B:
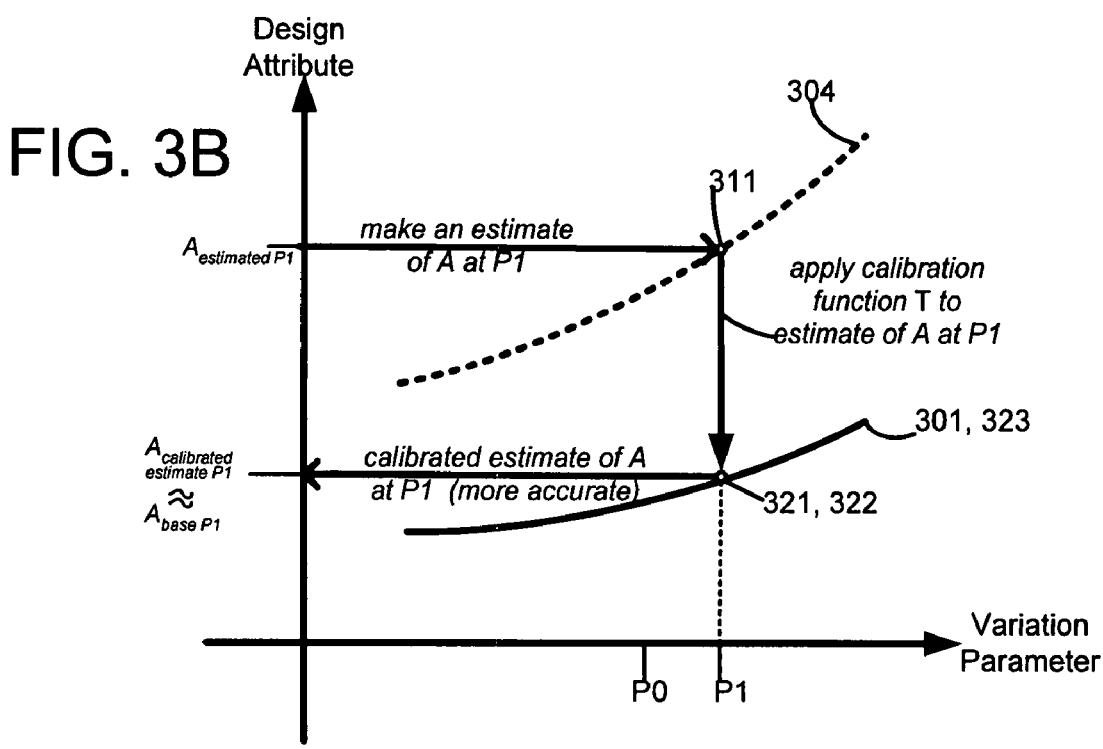
Figure 3C:
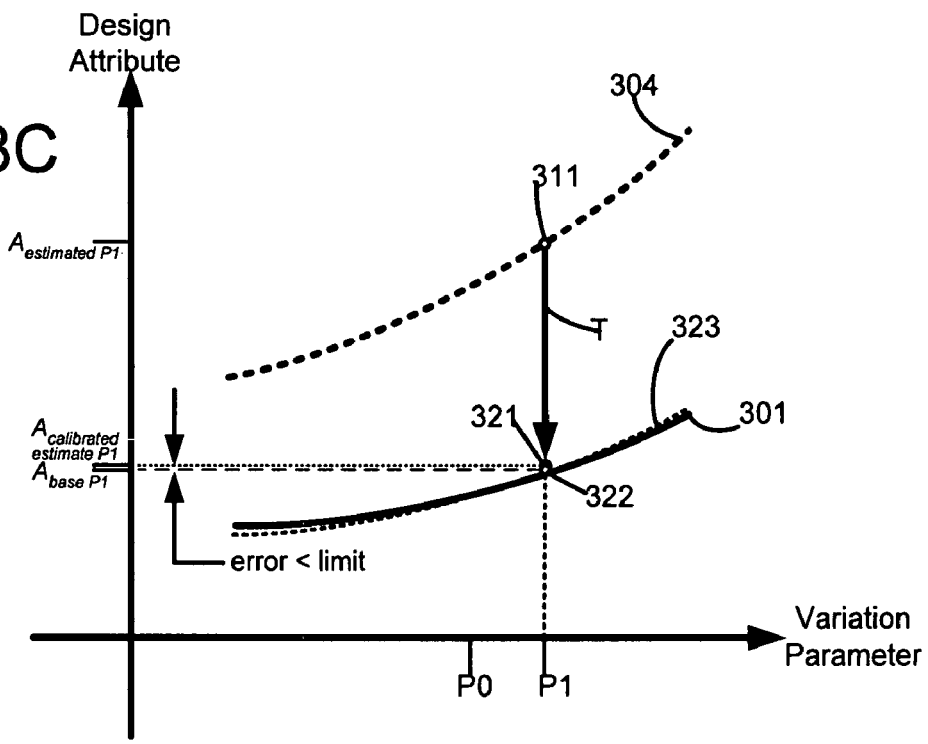

Use of an estimation technique in act 201 and a calibration function in act 202 is further described, in reference to FIGS. 3A-3C. FIG. 3A shows an illustrative example, wherein curve 301 illustrates how a design attribute of stage 100 (plotted along the y-axis) changes relative to a property of one or more devices in stage 100 (plotted along the x-axis), typically identified as a variation parameter. One example of a variation parameter in stage 100 is the resistance of interconnect 102 (FIG. 1) that has an effect on stage delay (which is an attribute of interest). Another example of an attribute of interest is effective capacitance of stage 100.

Specifically, several embodiments of computer 150 are also programmed to use in act 202 (FIG. 2) calibration functions that maps one or more estimated values obtained from the estimation technique to corresponding one or more values obtained from base value calculation. The one or more values which are used in the calibration functions may be obtained for predetermined sets of variation parameter values, e.g. nominal values and/or corner values. For example, if the nominal value of a variation parameter is P0, then the two values of a design attribute namely $A_{base\_P0}$ and $A_{estimated\_P0}$ are obtained (see points 302 and 303 on respective curves 301 and 304 of FIG. 3A) by respectively performing an accurate computation (which is slow) and the estimation technique for nominal values of variation parameters for stage 100. At this point in time, curve 301 (FIG. 3A) is unknown to computer 150 (except for nominal point 302). Curve 301 could be obtained by performing circuit simulation or by other accurate methods, but such computation can be avoided as discussed next.

When act 202 is performed, a function which is based on two values of the design attribute namely $A_{base\_P0}$ and $A_{estimated\_P0}$ is used to calibrate an estimated value for a set of one or more non-nominal values of the variation parameters. One illustrative example of such a calibration function T multiplies an estimated value from act 201 with a ratio a that is obtained by dividing $A_{base\_P0}$ with $A_{estimated\_P0}$, thereby to generate a calibrated estimate (and hence completing the performance of act 202). The generated calibrated estimate (see point 321 in FIG. 3B) has been found by the current inventors to match point 322 on curve 301 for the design attribute for non-nominal values of variation parameters. In samples where P1 is not close enough to P0, point 321 is on a curve 323 may show an error as compared to corresponding point 322 on curve 301 as illustrated in FIG. 3C. The just described example is just an illustration of a calibration function T, which may have different forms in different embodiments, and accordingly different percentages of cases may have errors of different percentages (which may be zero in some cases).

Due to the error being zero as shown in FIG. 3B for many samples or smaller than a predetermined limit thereon as shown in FIG. 3C for some samples, generation of relatively accurate values of an attribute, by estimation and calibration eliminates the need to use a computationally expensive method to generate any points on curve 301, except for nominal point 302 which is used identify a calibration function, as noted above. The predetermined limit on error is typically specified by the user, for example as a certain percentage of the attribute value, such as 0.1%.

Figure 3D:
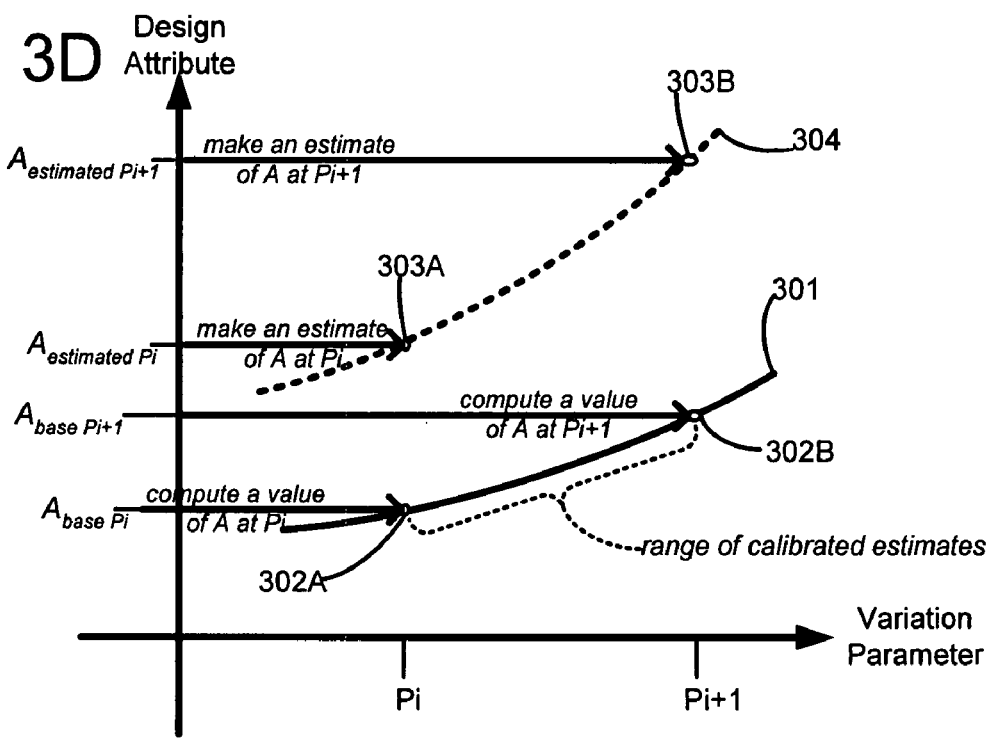
FIG. 3D illustrates, in a graph, an alternative embodiment, of the method illustrated in FIG. 3B.
Figure 5B:
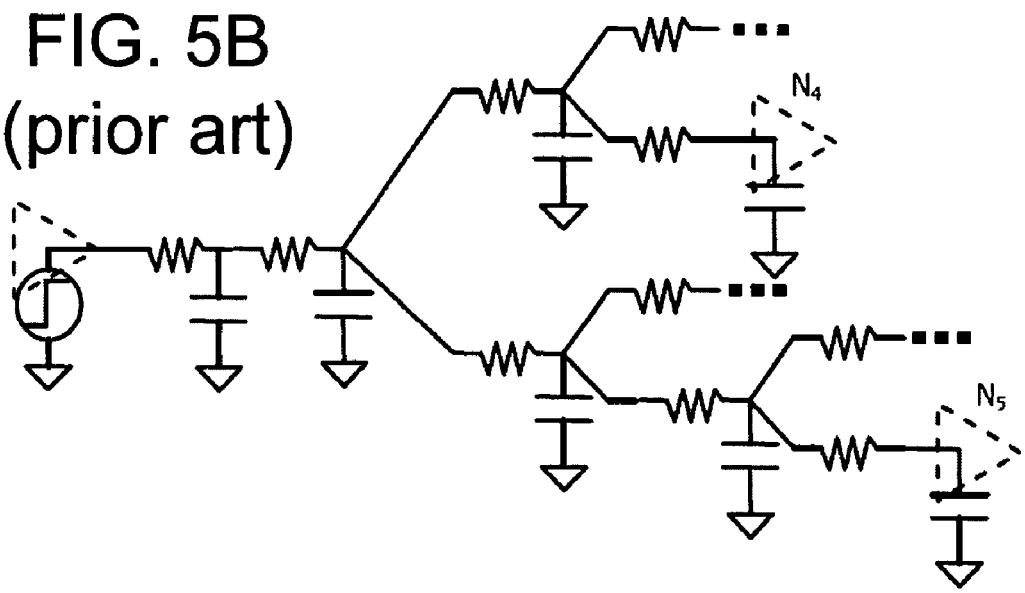

Note that FIGS. 3B and 3C illustrate an example for a single point calibration wherein curves 323 and 301 intersect at a single point 302 (and identification of the calibration function requires use of just a single base value of the attribute, namely the value $A_{base\_P0}$) However, in some applications, calibration by use of a function which is identified by a single point calibration provides insufficient accuracy, e.g. error greater than the predetermined limit. In such cases, multiple points are used to identify an appropriate calibration function by some embodiments, in a process called multi point calibration. For example, some embodiments use two points at two ends of a range Pi to Pi+1 of values of a parameter as shown in FIG. 3D, to implement two point calibration. In this example, a pair of estimates are made for the design attribute A, at the two ends of the range, namely $A_{estimated\_Pi}$ and $A_{estimated\_Pi+1}$. Additionally, a pair of base value calculations are also performed at the two ends of the range, to obtain two base values for the design attribute, namely $A_{base\_Pi}$ and $A_{base\_Pi+1}$ are obtained. These four values are thereafter used in identifying a calibration function T which may, for example, have a slope m and an intercept c to fit a linear equation of the form y=mx+c. In most cases, the inventors have found that use of such a two point calibration process identifies a calibration function T which provides relatively accurate values for design attribute A, if a suitable estimation technique has been used.

Figure 6:
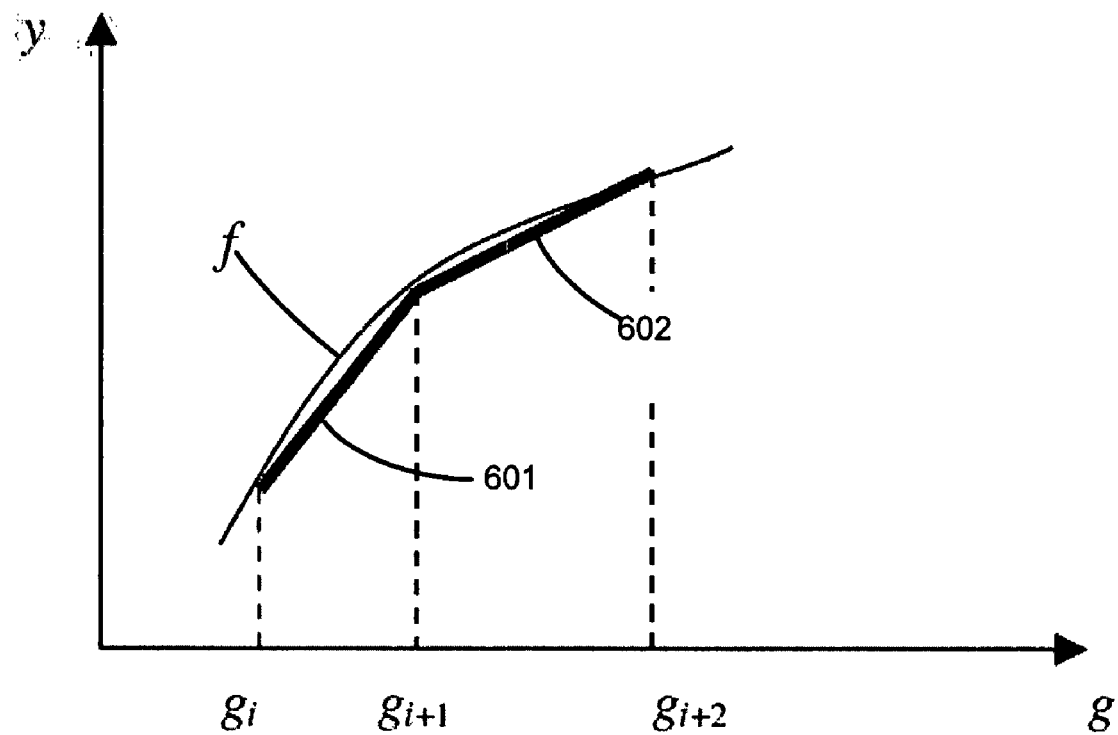
FIG. 6 illustrates a calibrated estimator function $f_e$ that is piece-wise linear relative to estimator function g in some embodiments of the invention.

Note that this process of identifying a calibration function is generalized to use more than two calibration points in other embodiments, thus this process allows any user-desired level of accuracy to be achieved. Obtaining (and using) a more accurate calibration function T is computationally expensive, so there is a balance between the level of accuracy achieved and the speedup produced by estimation and calibration as described herein. In several embodiments, a single point calibration is performed at the nominal values of all the variation parameters. Further, in certain embodiments, a two point calibration is performed at the minimum and maximum values of the variation parameters. Further, in several embodiments, a three point calibration as illustrated in FIG. 6 is performed at nominal, minimum and maximum values of variation parameters. Specifically, a sub-range between minimum and nominal is used to identify a first line 601 and another sub-range between nominal and maximum is used to identify a second line 602. Lines 601 and 602 are straight lines, each line having a slope and an intercept which are identified by performing a two point calibration on each sub-range, thereby to implement a three point calibration across the entire range between minimum and maximum. Note that the two lines 601 and 602 together identify a piece-wise linear calibration function in the range $g_i$ and $g_{i+2}$. In a similar manner, in some embodiments, when three or more calibrations are used, piece wise linear calibrations are used for different samples that lie within consecutive sets of calibrated points (i.e. by performing two point calibration multiple times, once for each of a number of sub-ranges). Note that instead of using a combination of the same type of functions within each sub-range (in FIG. 6 two linear functions are used), other embodiments use a combination of different types of functions in different sub-ranges (e.g. a scaling function in one sub-range and a linear function in another sub-range). Note that some embodiments use different number of calibrations for different attributes within computer 150. Further, it is also possible to increase the number of calibrations to achieve a user-desired level of accuracy.

Accordingly, a process requiring base value calculations for a large number of samples is replaced in many embodiments of the invention, by use of an estimation technique in act 201 (FIG. 2) and by calibration of the results of estimation in act 202. Either or both of acts 201 and 202 are selected to be computationally less expensive than, for example, circuit simulation in certain embodiments of the invention, thereby to allow determination of a design attribute's variation very quickly, relative to use of circuit simulation.

The inventors of the current patent application note that when the value of a variation parameter is fixed, a design attribute that is of interest may change monotonically relative to a calculation that is known to be easily performed (e.g. an arithmetic calculation), based on given values of variation parameters. For example, if the design attribute of interest is stage delay then the estimated stage delay in act 201 changes monotonically relative to an accurate stage delay that is obtained by base value calculation. Hence, several embodiments of computer 150 are programmed to take advantage of the just-described monotonically changing relationship, by repeated calibration after estimation to avoid repeated base value calculation.

Several embodiments of computer 150 are programmed to use multiplication with a ratio a as the calibration function, and calibrated estimates are used to perform Monte Carlo simulation in statistical timing analysis, which is therefore an application for method 200 (FIG. 2). Another use of such a ratio is in selection of Engineering Change Order (ECO) repair techniques, as described in reference to equation (3) in U.S. application Ser. No. 11/525,578, which has been incorporated by reference above. Estimation and calibration can also be used in statistical power analysis, by applying methods of the type described herein to the processes documented in the following papers which are incorporated by reference herein in their entirety: "Projection-Based Statistical Analysis of Full-Chip Leakage Power with Non-Log-Normal Distributions," by Xin Li, Jiayong Le and Lawrence T. Pileggi, DAC 2006, Jul. 24-28, 2006, San Francisco, Calif.; and "Statistical Estimation of Leakage Current Considering Inter and Intra-Die Process Variation" by Rajeev Rao, Ashish Srivatsava, David Blaauw and Dennis Sylvester, ISLPED 2003, Aug. 25-27, 2003, Seoul, Korea.

Note that the cell delay that is used in certain embodiments of an estimation technique is dependent on drive resistance, which in turn is computed based on effective capacitance that in turn needs to be estimated. Current inventors note that in most cases effective capacitance has a weak relationship to net resistance and a strong relationship to net total capacitance. So, one embodiment uses total capacitance even when interconnect resistance is changing across samples—because the effective capacitance itself changes monotonically relative to total capacitance of stage 100. In a few cases where effective capacitance is determined by computer 150 to be a strong function of net resistance, two or more calibration points are used by computer 150. Specifically, computer 150 determines the existence of such a strong function by checking whether net resistance is significantly large relative to drive resistance and if so then uses multi point calibration instead of single point calibration. For example, in some embodiments, computer 150 is programmed to check if net resistance is almost as large as drive resistance or if net resistance is half as large as drive resistance.

Note also that the effect of resistance is included in the base value computed by computer 150, and the amount of change in effective capacitance with respect to a change in resistance is sufficiently small to use calibrated estimates based on total capacitance as the estimated value. To take advantage of this additional monotonically changing relationship, several embodiments of computer 150 are further programmed to use computation of total capacitance as an estimation technique in act 201, in order to obtain estimated values of effective capacitance. Hence these embodiments use total capacitance values as estimated values (to be adjusted by a calibration function) of effective capacitance.

A specific estimation technique which is used by computer 150 for any given design attribute is determined manually in many embodiments of the invention. Such a determination may be made based on several factors, such as knowledge of relationships between parameters and attributes and/or physics and/or empirical data. The manual determination may also take into account computational expense of the calibration function to be performed on estimated values, and may be the result of a tradeoff between accuracy and speed for any given application. Accordingly, the following description which provides details on certain techniques used by computer 150 to compute estimated values (e.g. for stage delay or for effective capacitance) is merely illustrative, and not limiting.

Although the description herein, in reference to FIG. 2, illustrates certain embodiments of the invention applied to a single attribute, calibrated estimates for multiple attributes can be prepared by computer 150 in other embodiments wherein acts 201 and 202 for each attribute are interleaved relative to one another. For example, a first set of acts 201 may be performed for different attributes sequentially one after another, and the estimated values resulting therefrom may thereafter be calibrated in a second set of acts 202 which are performed subsequent to the first set. Furthermore, depending on the implementation, the first set of acts may be performed in a first computer while the second set of acts may be performed in a second computer, and in such an implementation the estimated values are transferred from the first computer to the second computer.

The above-described acts 201 and 202 are performed in certain embodiments, inside a method 400 (FIG. 4) implemented by computer 150 which performs an application, specifically static timing and noise analysis on an IC design. Note that in some alternative embodiments, such acts are performed in another application, e.g., static power analysis. Referring to FIG. 4, the IC design is received by computer 150 in act 401, and a stage in the IC design is selected for analysis in act 402 in the normal manner.

Next, in act 403, a circuit simulation or other accurate computation method for base value is performed by computer 150 on the selected stage, at nominal values of variation parameters, and using an average input slew, which is averaged over a slew distribution at the input of driver cell 101. The accurate computation in act 403 provides a base value for the design attribute of interest (such as cell delay), for use by computer 150 in identifying calibration function T (by single point calibration). Note that additional points could be used in base value calculations, to obtain more information about the quantity of interest, also for use in identifying calibration function T (by multiple point calibration).

Estimation technique and calibration function that are implemented by computer 150 in certain embodiments of the invention are formally described as follows. Let y be a quantity of interest such as a design attribute, e.g. cell or interconnect delay value. Then y can be described as a function of an input vector $x=[x_0, x_1, \ldots, x_n]$ in which the elements are all quantities that could impact the value of y, such as variation parameters, e.g. basic quantities of driver cell model, receiver cell loading effect and interconnect resistance, capacitance, and the variation parameters.

$$y=f(x) \quad (1)$$

Generally, function f is a nonlinear non-closed form function. For example, some embodiments run SPICE or use PRIMA to get a value of y that is typically considered precise (as opposed to approximate). PRIMA is described in the following article which is incorporated by reference herein in its entirety: "PRIMA: Passive Reduced-Order Interconnect Macromodeling Algorithm," by A. Odabasioglu, M. Celik, and L. Pileggi, published in *IEEE Trans. on CAD*, vol. 17, no. 8, pp. 645-654, 1998. Next step is to define an estimator function g. This is manually selected to be a simple function that could be evaluated very quickly but estimates the trend of y with respect to changes in the input vector x. Given the above, we can write $$y_e = g(x) \quad (2)$$

where $y_e$ is the estimated value by applying x to the estimator function g. Accordingly, estimator function g is implemented in several embodiments of computer 150 described above, as an estimation technique performed by a corresponding estimator 998.

Let us call T a calibration function (which when implemented in computer 150, yields a calibrator 999). This T is a function that transforms the estimated value $y_e$ to its precise value y at one or more calibration point(s). Finally let us define a calibrated estimator function $f_e$ as:

$$f_e(x) = T(y_e) = T(g(x))$$

$$f_e(x_i) = f(x_i) \quad 0 \leq i \leq N \quad (3)$$

where $x_i$ is the ith calibration point and N is number of calibration points. Suppose we choose T as a simple scaling function, then $f_e$ is represented as follows:

$$f_e(x) = ag(x). \quad (4)$$

In order to find the calibration ratio a, we need only one calibration point $x_0$. Thus, a can be found as:

$$a = \frac{f(x_0)}{g(x_0)} \quad (5)$$

It's possible that we couldn't identify a single estimator function g that could follow the trend of function f over a wide range of values of one or more elements of input vector x. In such cases, we employ multiple estimation techniques and calibration points to reduce the difference between f and $f_e$. FIG. 6 graphically shows the relationship between f and $f_e$ when we choose T as a linear function of g:

$$f_e(x) = a_i g(x) + b_i \text{ when } g_i \leq g(x) < g_{i+1} \quad (7)$$

where $g_i$ and $g_{i+1}$ are two base values (at which this linear function $f_e$ is bounded) that satisfy the following conditions at calibration points $x_i$ and $x_{i+1}$ (that define a sub-range):

$$g_i = g(x_i)$$

$$g_{i+1} = g(x_{i+1}) \quad (8)$$

Hence, g is selected appropriately to make the curvature of f with respect to g sufficiently small (within the error limits acceptable for a given application), between the calibration bounds $[g_i, g_{i+1}]$, so that $f_e$ matches f very closely in the sub-range being modeled. Note that equation (7) defines line 601 (FIG. 6) via the slope $a_i$ and intercept $b_i$. From equations (7) and (8), $a_i$ and $b_i$ are found for the sub-range between $x_i$ and $x_{i+1}$ as:

$$a_i = \frac{f(x_{i+1}) - f(x_i)}{g(x_{i+1}) - g(x_i)} \quad (9)$$

$$b_i = \frac{f(x_i)g(x_{i+1}) - f(x_{i+1})g(x_i)}{g(x_{i+1}) - g(x_i)} \quad (10)$$

Furthermore, for better accuracy, g can be a different function in each sub-range (also called calibration bound). In making an appropriate selection manually, a human implementer of the various embodiments balances the complexities of the estimation technique against the complexities of the calibration function (and the number of calibration points). The estimation technique is manually selected (as noted above to be fast because it is used many times, once for each of N samples. However, if the estimation technique is not sufficiently accurate (to ensure error below limit after use of calibration ratio a), then a more complex higher order calibration function or more calibration points are used for a given accuracy level, which in turn requires complex calculations and eventually increases runtime.

Accordingly, depending on the accuracy needed in some embodiments, various estimation techniques, such as Elmore delay, D2M, Variational D2M, and Fitted Elmore delay are used by computer 150, or even a simple RC time constant is used by computer 150, as described in one or more of the following articles each of which is incorporated by reference herein in its entirety are used in an estimation technique, to implement estimator 998:

Paul Penfield, Jr. and Jorge Rubinstein. "Signal Delay in RC Tree Networks", *IEEE Trans. on Computer-Aided Design*, vol. CAD-2, pp. 202-211, year 1983

C. J. Alpert, A. Devgan, C. V. Kashyap, "RC delay metric for performance optimization", *IEEE Trans. on CAD*, vol. 20, no. 5, pp. 571-582, year 2001

I. Abou-Seido, B. Nowak, C. Chu, "Fitted Elmore Delay: A simple and Accurate Interconnect delay model", *IEEE Trans. On VLSI*, vol. 12, no. 7, pp. 691-696, year 2004.

K. Agarwal, M. Agarwal, D. Sylvester, D. Blaauw, "Statistical Interconnect Metric for Physical-Design Optimization", IEEE Trans. On CAD, vol. 25, no. 7, pp. 1273-1288, year 2006.

In some embodiments, computer 150 obtains a single base value for effective capacitance that is more accurate than any estimated value. Several of these embodiments compute the nominal effective capacitance namely $\text{Nom\_C}_{effective}$ during the base value calculation. Specifically, effective capacitance obtained as a design attribute, is defined as an equivalent loading capacitance that is seen by a driver cell 101 (FIG. 1) when resistor shielding of interconnect 102 is taken in to account. This definition is further described in detail in an article entitled "Performance Computation for Precharacterized CMOS Gates with RC-loads", by F. Dartu et al. published in IEEE Transaction on CAD, vol. 15, pp. 544-555, May 1996 which article is incorporated by reference herein in its entirety.

Next, in act 404, an estimated value for the design attribute is computed by computer 150 using an estimation technique (same as the estimation technique used in act 202 described above in reference to FIG. 2, which act is performed act 201, as discussed next). Hence, in several embodiments computer 150 computes the total capacitance used in the calibration function at nominal values of various parameters (by setting $\Delta u_j$ and $\Delta v_j$ to zero). As shown in FIG. 3A, the nominal value of total capacitance $\text{Nom\_C}_{total}$ is located on another curve 304, at a point 303 thereon.

Thereafter, computer 150 determines a calibration function T (FIG. 3A) which maps the computed nominal total capacitance $\text{Nom\_C}_{total}$ to the computed nominal effective capacitance $\text{Nom\_C}_{effective}$ e.g. via the scaling ratio $\text{Nom\_C}_{effective}/\text{Nom\_C}_{total}$. Note that the just-described embodiments use only a single nominal value of each of the two capacitances (total and effective), for a given set of nominal values of various parameters. Instead of a single nominal value, other embodiments use two values, at two end points of a range (e.g. max and min), to compute such a ratio. Note also that function T can have any form (such as adding a constant, or even a non-linear function such as a quadratic), although a ratio a has been illustrated as implementing function T.

After act 404, acts 201 and 202 are performed by computer 150, in the above-described manner. Specifically, these two acts 201 and 202 are repeatedly performed by computer 150 for several points on a probability distribution centered around a single nominal point, in several embodiments that use estimation and calibration to perform Monte Carlo simulation. Act 202 is followed by act 405 in which computer 150 checks if all stages have been visited and if not, control returns to act 402.

If all stages have been visited, then characterization of the design attributes has been completed and act 406 is performed by computer 150. In act 406, the calibrated estimates are used in place of results of circuit simulation, to continue with the operations normally performed in the application, e.g. static timing and noise analysis, such as identifying timing-critical paths. In act 406, some embodiments use the calibrated estimates (from act 202) to identify any stages in the IC design that have timing and/or noise violations (e.g. stage 100 may be identified as being part of a critical timing path with negative timing slack).

A further detailed description of the estimation and calibration of acts 201 and 202 by computer 150 is described below for several design attributes.

Figure 1:
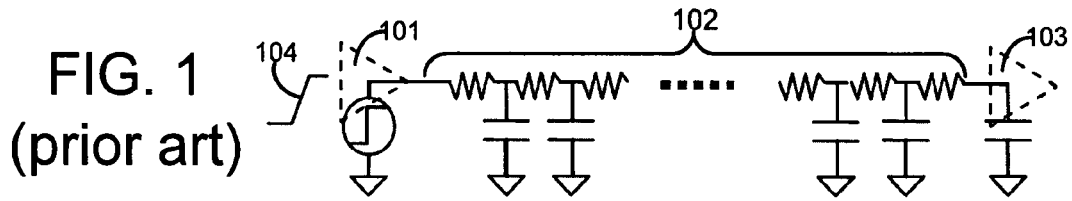
FIG. 1 illustrates a portion of a prior art IC design showing an enlarged view of an interconnect between a driver cell and a load cell.

Referring to FIG. 1, a stage 100 has only one interconnect 102, and stage 100 has only two pins, namely at cells 101 and 103. Accordingly, computer 150 computes the total capacitance as simply the sum, $C_{total}=C_{102}+C_{101}+C_{103}$. As noted above, each of $C_{101}$, $C_{102}$ and $C_{103}$ can vary from a nominal value thereof if the values of various parameters are not nominal. Hence, for stage 100, the value of total capacitance, i.e. $C_{total}$ is the result of computing the changed values of $C_{101}$, $C_{102}$ and $C_{103}$ and then adding them.

Note that in some embodiments in which calibration function T is implemented as a ratio a, this ratio a is used whenever act 202 is performed to calibrate an estimated value, for a set of one or more non-nominal values of the parameters. For example, when the capacitance and resistance values of interconnect 102 are changed, computer 150 multiplies an estimated value $C_{total\_new}$ resulting from act 201 with the ratio a, to obtain a calibrated estimate, as follows:

$$C_{effective\_new}=a*C_{total\_new}$$

The above-described ratio a for one illustrative implementation of calibration function T can be computed at any time relative to performance of act 201 (i.e. before or after) depending on the embodiment, but it is performed in most embodiments before act 202 because it is used in act 202. Moreover, in some embodiments, estimation and calibration in acts 201 and 202 are performed together in a single operation, also called calibrated estimation. Specifically, in certain embodiments, the above-described example, calibration with the above-described ratio in act 202 is performed together with computing the total capacitance in act 201, both of which are done in a single operation (called "calibrated estimation"), without explicit computation of the calibration function T as follows:

$$C_{effective\_new}=((\text{NOM\_}C_{effective}/\text{Nom\_}C_{total})*C_{total\_new}$$

Note that some embodiments do explicitly compute a scaling ratio [$\text{Nom\_}C_{effective}/\text{Nom\_}C_{total}$] to implement the calibration function T, and these embodiments cache the ratio in a memory of computer 150, for use in calibrating estimates of effective capacitance. Such calibration ratios can be computed ahead of time, for several attributes, so an appropriate ratio is readily available whenever the estimated value for a particular attribute is being calibrated.

Following steps are performed for a variation-aware attribute calculation in an illustrative embodiment, wherein all these steps are repeated for every stage in the design. The inputs to a variation-aware attribute calculator (which implements an estimator and a calibrator of the type described above) include but are not limited to input slew distribution, sampled values of variation parameters of the given stage, variation libraries as described later, variation-aware parasitics. The outputs of the variation-aware attribute calculator include but are not limited to cell delay and slew and net delay and slew distributions. As described in U.S. patent application Ser. No. 11/644,563 referenced earlier, variation-aware calculation of delay (as an attribute) uses a sampling approach, hence all the distributions are available as a large number of sampled values.

STEP 1: Computer 150 is programmed to compute nominal (average) slew from the input slew distribution:

Nom_slew=Average(input_slew_samples)

Note that the term "Nom_slew" is being used to denote the nominal value of slew as described earlier.

STEP 2: Computer 150 is programmed to compute a single base value for each of nominal slew, nominal library and nominal parasitics as follows (this performs act 403):
Nom_BaseValue_cell_delay,
Nom_BaseValue_net_delay,
Nom_BaseValue_cell_slew,
Nom_BaseValue_net_slew and
Nom_$C_{effective}$=function (Nom_slew, nominal library, nominal parasitics)

Note that Nom_$C_{effective}$ should have been Nom_BaseValue_$C_{effective}$ but we are using short notation here.

STEP 3: Computer 150 is also programmed to compute parametric Elmore delay as follows:
Parametric_Elmore_delay=g(variational_parasitics)

$$D_{elmore} = \text{Nom\_D}_{elmore} \cdot \left(1 + \sum_{i=1}^{m} d_i \Delta v_i\right)$$

Note that a nominal Elmore delay Nom_$D_{elmore}$ is computed in the normal manner from nominal values of capacitances and resistances on the interconnect, as described in a paper by W. C. Elmore, entitled "The transient response of damped linear network with particular regard to wideband amplifiers" J. Applied Physics, 19:55-63, year 1948, which is incorporated by reference herein in its entirety. In the above equations, the sensitivities $d_i$ are supplied as arrays of input data, in some embodiments of the invention. Here, there are "m" parasitic variations each of which affects at least wire capacitance or wire resistance of the interconnect. For more details on determining sensitivities $d_i$ for parametric Elmore delay given parasitic sensitivities, see Appendix A below. Since Elmore delay computation requires a tree kind of RC network, a multi-drive net is supported via per driver calculation (which fits into our definition of a stage), and any loops in RC network are broken by:
reducing to equivalent resistance for short loops between adjacent nodes or by
breaking the loop at the largest resistance for long loops.

Note further that results of STEP 3 are used to perform act 404 (FIG. 4) for net delay, in STEP 11 below.

STEP 4: Computer 150 is programmed to compute total wire capacitance as follows:

Suppose the net has "m" RC nodes. As described in the U.S. patent application Ser. No. 11/599,145 referenced earlier, the individual capacitances can be described as follows:

$C_1 C_1^{nom} + a_{11}\Delta v_1 + a_{12}\Delta v_2 + \ldots + a_{1n}\Delta v_n$ $C_2 = C_2^{nom} + a_{21}\Delta v_1 + a_{22}\Delta v_2 + \ldots + a_{2n}\Delta v_n$ $C_m = C_2^{nom} + a_{m1}\Delta v_1 + a_{m2}\Delta v_2 + \ldots + a_{mm}\Delta v_n$ wherein $C_i^{nom}$ is the nominal capacitance of RC node "i", $a_{ij}$ is sensitivity of the capacitance at RC node "i" due to a parasitic variation parameter "j" (e.g. metal width, metal thickness, dielectric thickness etc), and $\Delta v_j$ is the amount of variation in parasitic variation parameter "j" from it's nominal value. Also, "n" is the number of parasitic variation parameters that affect capacitances of an interconnect. Accordingly, in these embodiments, computer 150 computes the sum of interconnect capacitances as follows:

$$\text{Wire\_C}_{total} = \sum_{i=1}^{m} C_i = \frac{\left(\sum_{i=1}^{m} C_i^{nom}\right) + \left(\sum_{i=1}^{m} a_{i1}\right)\Delta v_1 +}{\left(\sum_{i=1}^{m} a_{i2}\right)\Delta v_2 + \ldots + \left(\sum_{i=1}^{m} a_{in}\right)\Delta v_n}$$

or $$\text{Wire\_C}_{total} = \text{Wire\_Nom\_C}_{total} + \sum_{j=1}^{n} p_j \Delta v_j$$

where $$\text{Wire\_Nom\_C}_{total} = \sum_{i=1}^{m} C_i^{nom} = C_1^{nom} + C_2^{nom} + \ldots + C_m^{nom}$$

and $$p_j = \left(\sum_{i=1}^{m} a_{ij}\right) = a_{1j} + a_{2j} + \ldots + a_{mj}$$

More specifically, several embodiments of the invention compute and cache the values of Wire_Nom_$C_{total}$ and $p_j$ described above. Note that results of STEP 4 are used to perform act 404 (FIG. 4) for effective capacitance.

STEP 5: Computer 150 is programmed to compute total wire resistance for each load on the net as follows:

Suppose there are "q" resistances on the interconnect path between the driver of the stage to a given load. As described in the U.S. patent application Ser. No. 11/599,145 referenced earlier, the individual resistances can be described as follows:

$R_1 = R_1^{nom} + c_{11}\Delta v_1 + c_{12}\Delta v_2 + \ldots + c_{1r}\Delta v_n$ $R_2 = R_2^{nom} + c_{21}\Delta v_1 + c_{22}\Delta v_2 + \ldots + c_{2r}\Delta v_r$ $\ldots$ $R_q = R_q^{nom} + C_{q1}\Delta v_1 + c_{q2}\Delta v_2 + \ldots + C_{qr}\Delta v_r$ wherein $R_i^{nom}$ is the nominal resistance of RC segment "i", $c_{ij}$ is sensitivity of the resistance of RC segment "i" due to a parasitic variation parameter "j" (e.g. metal width, metal thickness etc), and $\Delta v_j$ is the amount of variation in parasitic variation parameter "j" from it's nominal value. Also, "r" is the number of parasitic variation parameters that affect resistances of an interconnect. Accordingly, in these embodiments, computer 150 computes the sum of interconnect resistances as follows:

$$R_{total\_endpoint} = \sum_{i=1}^{q} R_i = \begin{pmatrix} \sum_{i=1}^{q} R_i^{nom} \end{pmatrix} + \begin{pmatrix} \sum_{i=1}^{q} c_{i1} \end{pmatrix} \Delta v_1 + \begin{pmatrix} \sum_{i=1}^{q} c_{i2} \end{pmatrix} \Delta v_2 + \ldots + \begin{pmatrix} \sum_{i=1}^{q} c_{ir} \end{pmatrix} \Delta v_r$$

or $$R_{total\_endpoint} = \text{Wire\_Nom\_R}_{total\_endpoint} + \sum_{j=1}^{r} k_j \Delta v_j$$

where $$\text{Wire\_Nom\_R}_{total\_endpoint} = \begin{pmatrix} \sum_{i=1}^{q} R_i^{nom} \end{pmatrix} = R_1^{nom} + R_2^{nom} + \ldots + R_q^{nom}$$

and $$k_j = \begin{pmatrix} \sum_{i=1}^{q} c_{ij} \end{pmatrix} = c_{1j} + c_{2j} + \ldots + c_{mj}$$

More specifically, several embodiments of the invention compute and cache the values of Wire_Nom_$R_{total}$ and $k_j$ described above. Note that results of STEP 5 are used to perform act 404 (FIG. 4) for net delay.

STEP 6: Computer 150 is programmed to compute total pin capacitance of the stage as follows:

Suppose there are "s" number of pins on the current net. Current inventors note that the pin capacitances of these pins can be expressed as follows:

$$Cpin_1 = Cpin_1^{nom} + b_{11}\Delta u_1 + b_{12}\Delta u_2 + \ldots + b_{1t}\Delta u_t$$

$$Cpin_2 = Cpin_2^{nom} + b_{21}\Delta u_1 + b_{22}\Delta u_2 + \ldots + b_{2t}\Delta u_t$$

$$\ldots$$

$$Cpin_s = Cpin_s^{nom} + b_{s1}\Delta u_1 + b_{s2}\Delta u_2 + \ldots + b_{st}\Delta u_t$$

wherein $Cpin_i^{nom}$ is the nominal pin capacitance of pin "i", $b_{ij}$ is sensitivity of the pin capacitance of pin "i" due to a device variation parameter "j" (e.g. channel length, threshold voltage etc), and $\Delta v_j$ is the amount of variation in device variation parameter "j" from it's nominal value. Also, "t" is the number of device variation parameters that affect pin capacitances. Moreover, in these embodiments, computer 150 also computes the sum of pin capacitances, as follows:

$$C_{pin\_total} = \sum_{i=1}^{s} Cpin_i = \begin{pmatrix} \sum_{i=1}^{s} Cpin_i^{nom} \end{pmatrix} + \begin{pmatrix} \sum_{i=1}^{s} b_{i1} \end{pmatrix} \Delta u_1 + \begin{pmatrix} \sum_{i=1}^{s} b_{i2} \end{pmatrix} \Delta u_2 + \ldots + \begin{pmatrix} \sum_{i=1}^{s} b_{it} \end{pmatrix} \Delta u_t$$

or $$C_{pin\_total} = \text{Nom\_C}_{pin\_total} + \sum_{j=1}^{t} e_j \Delta v_j$$

where $$\text{Nom\_C}_{pin\_total} = \begin{pmatrix} \sum_{i=1}^{s} Cpin_i^{nom} \end{pmatrix} = Cpin_1^{nom} + Cpin_2^{nom} + \ldots + Cpin_s^{nom}$$

and $$e_j = \begin{pmatrix} \sum_{i=1}^{t} b_{ij} \end{pmatrix} = b_{1j} + b_{2j} + \ldots + b_{sj}$$

More specifically, several embodiments of the invention compute and cache the values of Nom_$C_{pin\_total}$ and $e_j$ described above. Note that results of STEP 6 are used to perform act 404 (FIG. 4) for effective capacitance.

STEP 7: Computer 150 is programmed to perform estimation act 404, for effective capacitance. Effective capacitance is estimated by total capacitance on the net which can be computed as follows:

Nom_$C_{total}$=Wire_Nom_$C_{total}$+Nom_$C_{pin\_total}$

STEP 8: Computer 150 is programmed to perform estimation act 404, for cell delay/slew, by computing:

$D^{nom}$=delay_table_lookup(Nom_slew,Nom_$C_{effective}$, Nom_condition)

$S^{nom}$=slew_table_lookup(Nom_slew,Nom_$C_{effective}$, Nom_condition)

Estimated_nom_cell_delay=$D^{nom}$

Estimated_nom_cell_slew=$S^{nom}$

In the above equations to determine estimated values ($D^{nom}$, $S^{nom}$), note that a computer performing the table lookup receives as input the nominal slew, computed in STEP 1. The table look up performance also receives as input the nominal effective capacitance which was computed in STEP 2. Note that in these embodiments, the user provides libraries that are to be used in the table lookup. Such libraries are generated by a fabrication facility, such as Taiwan Semiconductor Manufacturing Company, LTD (TSMC). Also, note that the library data used in this step are at nominal condition.

STEP 9: Computer 150 is programmed to perform a sensitivity calculation as follows—sensitivity of cell delay/slew is computed with respect to every cell variation parameter.

Here, $D_i^{cor}$ is the corner delay (within 1 sigma) for device parameter i, and $D^{nom}$ is the nominal delay from STEP 8.

$$D_i^{cor} = \text{delay\_table\_lookup}(\text{Nom\_slew, Nom\_C}_{effective}, \text{corner\_condition})$$

$$u_i^{cor} = \text{value\_of\_parameter@corner}$$

$$u_i^{nom} = \text{value\_of\_parameter@nom}$$

$$Sen_i = \begin{pmatrix} \dfrac{D_i^{cor} - D^{nom}}{u_i^{cor} - u_i^{nom}} \end{pmatrix} * \dfrac{1}{D^{nom}}$$

For the sensitivity calculation shown above, the computer 150 is programmed to use the nominal slew computed in STEP 1 and nominal effective capacitance computed in STEP 2. Similar sensitivities are also obtained for cell slew in addition to cell delay. The computer is programmed to prepare sensitivity values for each variation parameter, which is used to generate just estimates (as per act 201 of FIG. 2) of the cell delay and cell slew as discussed below in STEP 15. Note that in these embodiments, the user provides library data that are used in the table lookup, such as a corner case library data and a typical library data. For example, if channel length is the parameter, then in these embodiments the user provides different library data that are characterized at different values of channel length, such as one library data for nominal value, and another library data (e.g. for +20% variation) in channel length. Depending on the embodiment, the user may provide two corner library data, one on each side of the nominal value (e.g. +20% corner library data and also −20% corner library data). The software in such embodiments is programmed to use only one corner library data if only one is provided by the user, but if two corner library data are provided then both are used. These library data could be provided in form of multiple libraries or a single library that have the all corner and nominal data in it.

STEP 10: Computer 150 is programmed to estimate nominal drive resistance $Nom\_R_d$ based on $$Nom\_R_d = \frac{Estimated\_nom\_cell\_slew}{Nom\_C_{effective} * \ln\left(\frac{V_l - 1}{V_h - 1}\right)}$$

wherein $V_l$ and $V_h$ are low and high slew trip points. Note that Estimated_nom_cell_slew was computed in STEP 8. Moreover, $Nom\_C_{effective}$ was computed in STEP 2. Note that results of STEP 10 are used to perform act 404 (FIG. 4) for net delay.

STEP 11: Compute estimated nominal net delay:

$$D_{drv} = Nom\_R_d * Nom\_C_{eff}$$

$$D_{load} = Nom\_R_d * Nom\_C_{total} + Nom\_D_{elmore} + Wire\_Nom\_R_{total\_endpoint} * Nom\_C_{pin\_total}$$

$$Estimated\_nom\_Net\_delay = D_{load} - D_{drv}$$

Note that $Nom\_R_d$ was computed in STEP 10, $Nom\_C_{total}$ is computed in STEP 7, $Nom\_D_{elmore}$ was computed in STEP 3, $Wire\_Nom\_R_{total\_endpoint}$ was computed in STEP 5 and $Nom\_C_{pin\_total}$ was computed in STEP 6. Note that results of STEP 11 are used to perform act 404 (FIG. 4) for net delay.

STEP 12: Computer 150 is programmed to compute estimated nominal net slew:

$$Estimated\_nom\_Net\_Slew = \left(\begin{array}{c} Nom\_R_d * Nom\_C_{total} + \\ Estimated\_nom\_Net\_Delay \end{array}\right) * \ln\left(\frac{V_l - 1}{V_h - 1}\right)$$

Note that $Nom\_R_d$ was computed in STEP 10, $Nom\_C_{total}$ is computed in STEP 7 and Estimated_nom_Net_Delay was computed in STEP 11. Note that results of STEP 12 are used to perform act 404 (FIG. 4) for net slew.

STEP 13: Computer 150 is also programmed to identify a calibration function T, as a scaling factor for the following attributes:

$$Ceff\_scaling\_factor = \frac{Nom\_C_{effective}}{Nom\_C_{total}}$$

$$Cell\_delay\_scaling\_factor = \frac{Nom\_BaseValue\_cell\_delay}{Estimated\_nom\_cell\_delay}$$

$$Cell\_slew\_scaling\_factor = \frac{Nom\_BaseValue\_cell\_slew}{Estimated\_nom\_cell\_slew}$$

$$Net\_delay\_scaling\_factor = \frac{Nom\_BaseValue\_net\_delay}{Estimated\_nom\_net\_delay}$$

$$Net\_slew\_scaling\_factor = \frac{Nom\_BaseValue\_net\_slew}{Estimated\_nom\_net\_slew}$$

Note that all the base values were computed in STEP 2, Estimated_nom_cell_delay and Estimated_nom_cell_slew were computed in STEP 8, while Est_nom_net_delay and Est_nom_net_slew were computed in STEPS 11 and 12 above. Note that results of STEP 13 are used to perform act 202 (FIG. 4) for effective capacitance, cell delay, net delay and net slew.

STEP 14: Computer 150 is further programmed to implement calibrated estimation (see acts 201 and 202 in FIG. 2 or in FIG. 4) for effective capacitance by doing the following:

For each sample (and typically there are 100s of samples), compute:

$$Wire\_C_{total} = Wire\_Nom\_C_{total} + \sum_{i=1}^{m} p_i \Delta v_i$$

$$C_{pin\_total} = Nom\_C_{pin\_total} + \sum_{j=1}^{t} e_j \Delta v_j$$

$Wire\_C_{total}$ is computed by incorporating the sample values for all the parasitic variation parameters that affect interconnect capacitances into the equation derived in STEP 4 earlier. $C_{pin\_total}$ is computed by incorporating the sample values for all the device variation parameters that affect pin capacitances into the equation derived in STEP 6 earlier. Finally, total capacitance can be computed by adding these two quantities.

$$Sample\_C_{total} = Wire\_C_{total} + C_{pin\_total}$$

The resulting total capacitance $C_{total}$ is thereafter used as an estimate of the effective capacitance (i.e. the result of act 201), and this estimate is thereafter calibrated as described below.

$$Sample\_C_{effective} = Ceff\_scaling\_factor * Sample\_C_{total}$$

STEP 15: Computer 150 is further programmed implement a calibrated estimation act (see acts 201 and 202 in FIG. 2 or FIG. 4) for cell delay and slew by doing the following:

For each sample (and typically there are 1000s of samples), compute:

$D^{nom}(s, c) = $ delay_table_lookup(Sample_slew, $Sample\_C_{effective}$, Nom_condition)

$u_i^{sample} = $ value_of_parameter$_i$ @ sample $u_i^{nom} = $ value_of_parameter$_i$ @ nom Estimated_sample_cell_delay = $D^{nom}(s, c) *$ $$\left(1 + \sum_{i=1}^{q} Sen_i * \left(u_i^{sample} - u_i^{nom}\right)\right)$$

$S^{nom}(s, c) = $ table_lookup(Sample_slew, $Sample\_C_{effective}$, Nom_condition)

Estimated_sample_cell_slew = $S^{nom}(s, c) *$ $$\left(1 + \sum_{i=1}^{q} Sen_i * \left(u_i^{sample} - u_i^{nom}\right)\right)$$

Note that the "sample_slew" is an input to the variation-aware attribute calculator as described earlier, the sensitivities Sen$_i$ were computed earlier in STEP 9, and Sample_C$_{effective}$ was computed in STEP 14. The following calibrated estimates are then computed:

Sample_cell_delay=Cell_delay_scaling_factor*Estimated_sample_cell_delay

Sample_cell_slew=Cell_slew_scaling_factor*Estimated_sample_cell_slew

Note that the scaling factors are obtained earlier in STEP 13.

STEP 16: Computer 150 is programmed to compute drive resistances for each sample as follows:
For each sample (and typically there are 1000s of samples), compute:

$$\text{Sample\_R}_d = \frac{\text{Estimated\_sample\_cell\_slew}}{\text{Sample\_C}_{\textit{effective}} * \ln\left(\frac{V_l - 1}{V_h - 1}\right)}$$

Note that Estimated_sample_cell_slew was computed earlier in STEP 15 and Sample_C$_{effective}$ was computed in STEP 14. Note that results of STEP 16 are used to perform acts 201 and 202 (FIG. 4) for net delay.

STEP 17: Net delay calculation computes D$_{elmore}$ (variational elmore delay), R$_{total\_endpoint}$ (variational total path resistance to a load), D$_{drv}$ (variational delay at driver), D$_{load}$ (variational delay at load), and Est_Net_delay (variational estimated net delay) as follows:
For each sample (and typically there are 1000s of samples), compute:

$$D_{elmore} = D_{elmore}^{nom} \cdot \left(1 + \sum_{i=1}^{m} e_i \Delta v_i\right)$$

$$R_{total\_endpoint} = \text{Wire\_Nom\_R}_{total\_endpoint} + \sum_{i=1}^{m} k_i \Delta v_i$$

$$D_{drv} = \text{Sample\_R}_d * \text{Sample\_C}_{\textit{effective}}$$

$$D_{load} = \frac{\text{Sample\_R}_d * \text{Sample\_C}_{total} +}{D_{elmore} + R_{total\_endpoint} * C_{pin\_total}}$$

Estimated_sample_Net_delay = $D_{load} - D_{drv}$

D$_{elmore}$ is computed by incorporating the sample values for all the parasitic variation parameters that affect interconnect capacitances or resistances into the equation derived in STEP 3 earlier. R$_{total\_endpoint}$ is computed by incorporating the sample values for all the parasitic variation parameters that affect interconnect resistances into the equation derived in STEP 5 earlier. C$_{pin\_total}$ is computed by incorporating the sample values for all the device variation parameters that affect pin capacitances into the equation derived in STEP 6 earlier. In fact, this quantity was already computed in STEP 14 earlier. The following calibrated estimates are then computed:

Sample_net_delay=Net_delay_scaling factor*Estimated_sample_net_delay

Note that scaling factor was obtained earlier in STEP 13.
STEP 18: Finally, computer 150 is programmed to perform calibrated estimation for net slew as follows:

For each sample (and typically there are 1000s of samples), compute:

$$\text{Estimated\_sample\_net\_slew} = \left(\frac{\text{Sample\_R}_d * \text{Sample\_C}_{total} +}{\text{Estimated\_sample\_net\_delay}}\right) * \ln\left(\frac{V_l - 1}{V_h - 1}\right)$$

$$\text{Sample\_net\_slew} = \frac{\text{Net\_slew\_scaling\_factor} *}{\text{Estimated\_sample\_net\_slew}}$$

Note that scaling factor was obtained earlier in STEP 13. Note also that results of STEP 18 are used to perform acts 201 and 202 (FIG. 4) for net delay. In several embodiments of the invention, the sample cell delay, cell slew, net delay and net slew are returned from the variation-aware attribute calculator as the distributions of these attributes.

Cell driver resistance for nominal and sample cases were calculated in STEP 10 and STEP 16 respectively. Here are some other alternative methods to determine cell driver resistance as an illustrative embodiment. Delay from an input to an output of a cell, as well as the slew at the output of a cell are pre-characterized or calculated from a pre-characterized set of current waveforms in lookup tables as functions on cell input slew and capacitive output loading. In cases where the loading of the cell is pure capacitive (lumped), the tables are used directly to predict the delay and output slew of the cell. In cases where the loading is distributed and the interconnection between cells is represented with combination of resistors and capacitors, the tables are used to extract a thevenin driver model driving the mentioned interconnection. Extraction of this thevenin driver model could be base on, but not limited to:

Step response using slew and/or delay tables and total/effective load capacitance Ramp response using slew and/or delay tables and total/effective load capacitance Ramp response using slew and/or delay tables, derivative of slew and/or delay and total/effective load capacitance The extraction of the driver model could be done using other methods or variations of the above mentioned methods.

In some embodiments of the invention, each trial run of the Monte Carlo simulation for a stage is performed by choosing values from the probability distribution of the interconnect variation sources. These variation sources could be fully or partially correlated or be completely independent from each other. Based on the chosen values from the distributions, the extracted electrical values for the chip interconnect such as individual segment resistance and capacitance varies as described in an article entitled "Statistical Interconnect Metric for Physical-Design Optimization" by K. Agarwal et al. published in IEEE Trans. On CAD, vol. 25, No. 7, pp 1273-1288, 2006. The just-described article is incorporated by reference herein in its entirety. The current inventors note that overall interconnect topology stays the same across each Monte Carlo Simulation trial run. Hence the current inventors note that recalculating the whole stage delay for each trail run may be inefficient for some applications.

Accordingly, several embodiments of the invention are programmed to use SPICE (or other such base value calculation) sparingly, for only a few cases with predefined variation values, and store the results for them. As noted above certain embodiments use an estimation technique to predict the stage delays for a number of other cases (defined in sets of values as noted above) based on the stored values obtained from SPICE (or other such base value calculation) and also based on certain estimation metrics. The estimation metric (and accordingly an estimation technique to be used to compute the estimation metric) is manually selected, for having the same trend as the actual stage delay, with respect to the changes in variation sources to enable accurate estimations. The following table summarizes an estimation metric and a corresponding estimation technique that are used in some embodiments:

| DESIGN ATTRIBUTE | ESTIMATION METRIC | ESTIMATION TECHNIQUE |
| --- | --- | --- |
| Effective capacitance | Total capacitance | Summation of wire and pin capacitances |
| Cell delay | NLDM cell delay | Lookup based on effective capacitance and interpolation based on sensitivities |
| Cell slew | NLDM cell slew | Lookup based on effective capacitance and interpolation based on sensitivities |
| Net delay | Elmore delay | Elmore delay computation based on sensitivities and drive resistance (in turn based on cell slew) |
| Net slew | Net delay | Based on cell slew and scaling of net delay |

As noted above, use of an estimation technique of the type described above with a calibration formula (which is identified by a single point or multi point calibration process) speed up of the Monte Carlo simulations significantly relative to use of base value calculations.

As noted above, with a well chosen combination of estimation technique and calibration function, the process of Monte Carlo simulation is accelerated in several embodiments of the invention, when dealing with correlated variation of interconnect resistance and capacitance. Hence, many embodiments of the invention use as an estimation technique any easily-calculated value that has the same trend as the design attribute of interest, with respect to the varying variation parameters, to achieve speed up in computation significantly relative to simulation. The estimation technique and the calibration function are selected to ensure their evaluation is much quicker than circuit simulation to obtain a base value of a design attribute.

Hence, several embodiments have been shown to accelerate the Monte Carlo simulations for interconnect process variation by orders of magnitude. Selecting efficient estimator and calibrator functions is done manually, to optimize the performance and accuracy of such embodiments. Any delay estimation technique which is computationally inexpensive such as Elmore delay or D2M can be used to improve accuracy, relative to various simple embodiments described herein. Although some embodiments are applied to interconnect variation, other embodiments are applied to other methods that require Monte Carlo simulations or multiple computations handling non-linear behavior. Certain embodiments use estimation and calibration as described herein to implement process variation aware signal integrity analysis.

Another embodiment of this invention is variation-aware crosstalk noise calculation by computer 150 which involves deriving variation of crosstalk noise due to variation of the circuit parameters. In order to perform variation-aware crosstalk-aware calculation, the same method as described in FIG. 4 are performed by computer 150. However, the attribute(s) in this embodiment correspond(s) to crosstalk noise or crosstalk delay and slew. The noise estimation by computer 150 involves estimating the noise waveform characteristics such as peak voltage based on information related to the stage. The noise characteristic in some cases is a simple parameter such as peak voltage as well as more complicated parameter or set of parameters such as a trio of peak voltage, noise duration (or area) and shape factor, or just a piecewise-linear voltage waveform of the noise. In some embodiments, the peak noise estimation is calculated using the following equation:

$$V_P = \frac{V_{DDa}}{1 + \frac{C_2}{C_X} + \frac{R_1}{R_2}\left(1 + \frac{C_1}{C_X}\right)}$$

Where C1, C2 are effective capacitances as seen by the victim and aggressor drivers. $C_x$ is the total coupling capacitances between the two nets. R1 and R2 are effective drive resistances of victim and aggressor drivers. Other embodiments may not include some of these parameters such as R1 and R2 for simplicity or faster computation. Some other embodiments use total capacitances of each net for C1 and C2 values. Similar estimation can also be done on the estimation of other noise parameters such as noise duration.

Another embodiment of this invention is for determining variation-aware crosstalk delay and slew by computer 150. This embodiment is achieved by combining variational delay and slew calculation presented above and variational noise calculation presented above in computer 150, by using the following equation:

$$\text{crosstalk\_delay} = \text{slew} * \frac{\sum V_P}{\text{Victim\_Voltage}}$$

Figure 8:
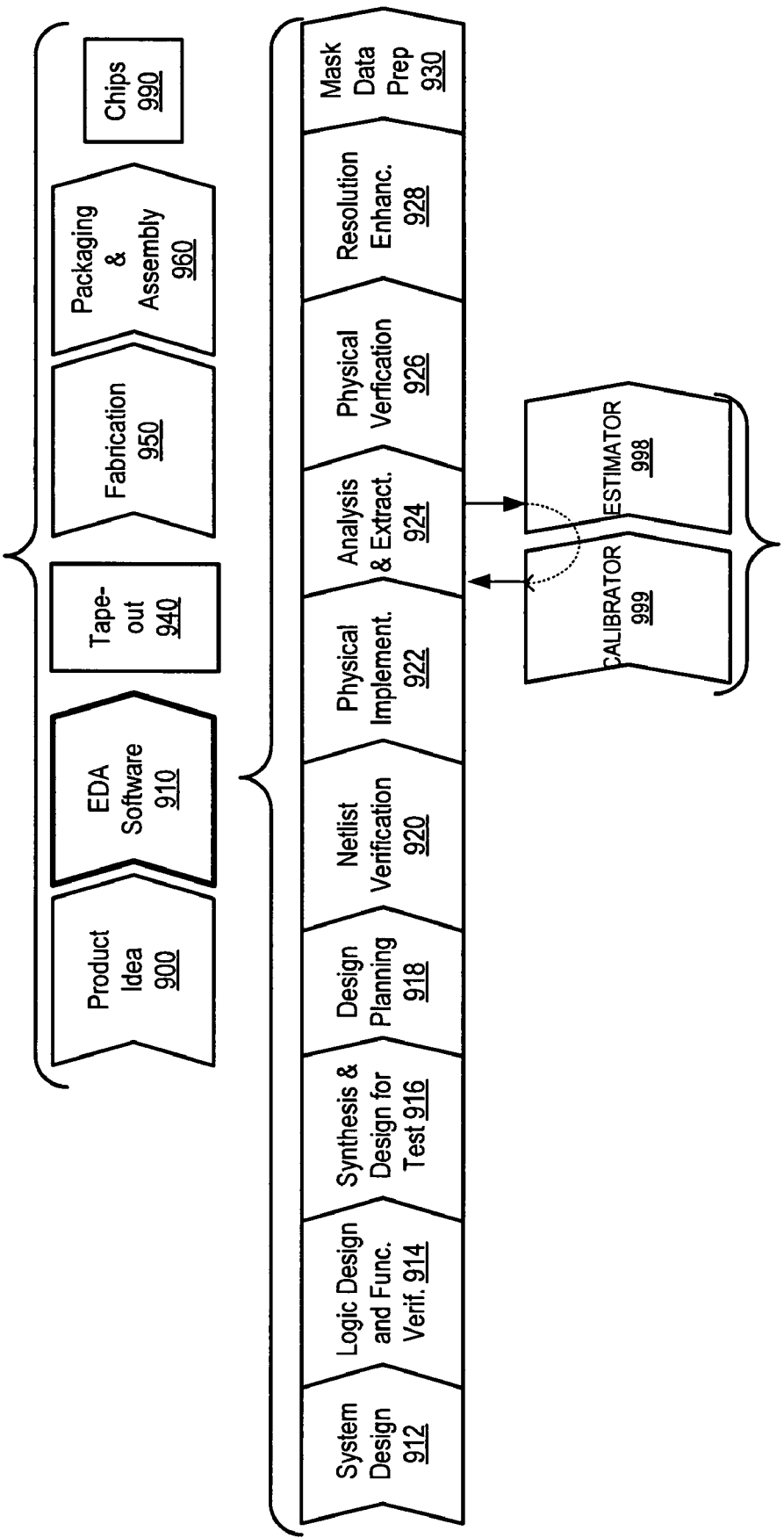
FIGS. 8 and 9 illustrate simplified representations of two exemplary digital ASIC design flows that use an estimator and a calibrator, in accordance with the invention.

Accordingly, the method of FIG. 4 is used in some embodiments of an EDA software design process (shown as 910 in FIG. 8). Process 910 (FIG. 8) is actually composed of a number of stages 912-930, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC. A brief description of the components of the EDA software design process (stage 910) will now be provided.

System design (stage 912): The circuit designers describe the functionality that they want to implement, they can perform what-if planning to refine functionality, check costs, etc. Hardware-software architecture partitioning can occur at this stage. Exemplary EDA software products from Synopsys, Inc. that can be used at this stage include Model Architect, Saber, System Studio, and DesignWare® products.

Logic design and functional verification (stage 914): At this stage, the VHDL or Verilog code for modules in the system is written and the design (which may be of mixed clock domains) is checked for functional accuracy. Exemplary EDA software products from Synopsys, Inc. that can be used at this stage include VCS, VERA, DesignWare®, Magellan, Formality, ESP and LEDA products.

Synthesis and design for test (stage 916): Here, the VHDL/Verilog is translated to a gate level netlist. The netlist can be optimized for the target technology. Additionally, the design and implementation of tests to permit checking of the finished chip occurs. Exemplary EDA software products from Synopsys, Inc. that can be used at this stage include Design Compiler®, Physical Compiler, Test Compiler, Power Compiler, FPGA Compiler, Tetramax, and DesignWare® products.

Design planning (stage 918): Here, an overall floorplan for the chip is constructed and analyzed for timing and top-level routing. Exemplary EDA software products from Synopsys, Inc. that can be used at this stage include Jupiter and Floorplan Compiler products.

Netlist verification (stage 920): At this step, the netlist is checked for compliance with timing constraints and for correspondence with the VHDL/Verilog source code. Exemplary EDA software products from Synopsys, Inc. that can be used at this stage include VCS, VERA, Formality and PrimeTime® products (applied to pre-layout IC designs). Note that timing analysis at this stage is performed in PrimeTime® based on simplified models that do not take into account capacitive coupling and crosstalk.

Figure 9:
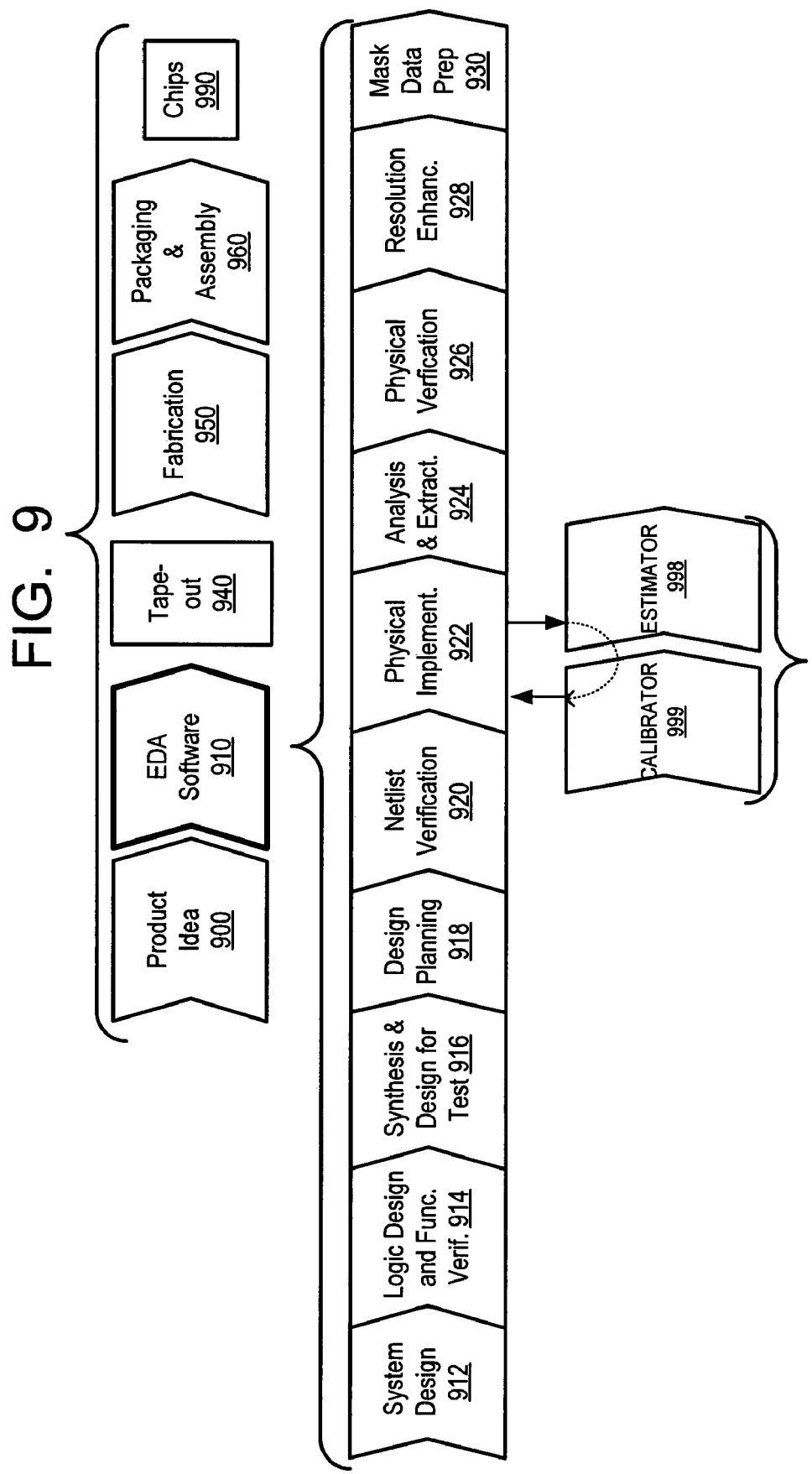

Physical implementation (stage 922): The placement (positioning of circuit elements, such as the above-described sequential cells and combinational cells) and routing (connection of the same) occurs at this step. Exemplary EDA software products from Synopsys, Inc. that can be used at this stage include the Astro, IC Compiler product. Note that an estimator 998 and a calibrator 999 (of the type described above in reference to FIG. 7A) can be used in an iteration through this stage 922, as shown in FIG. 9. Although circuitry and portions thereof (such as rectangles) may be thought of at this stage as if they exist in the real world, it is to be understood that at this stage only a layout exists in a computer 150. The actual circuitry in the real world is created after this stage as discussed below.

Analysis and extraction (stage 924): At this step, the circuit function is verified at a transistor level, this in turn permits what-if refinement. Exemplary EDA software products from Synopsys, Inc. that can be used at this includes Star RC/XT, Raphael, Aurora and PrimeTime® SI products (applied to post-layout IC designs). Note that timing analysis at this stage is performed in PrimeTime® SI based on capacitive coupling and crosstalk models. Hence, some embodiments use PrimeTime® SI at this stage to perform acts 201 and 202 shown in FIG. 2. Hence, an estimator 998 and a calibrator 999 (of the type described above in reference to FIG. 7B) can be used in an iteration through this stage 924, as shown in FIG. 8.

Physical verification (stage 926): At this stage various checking functions are performed to ensure correctness for: manufacturing, electrical issues, lithographic issues, and circuitry. Exemplary EDA software products from Synopsys, Inc. that can be used at this stage include the Hercules product.

Resolution enhancement (stage 928): This involves geometric manipulations of the layout to improve manufacturability of the design. Exemplary EDA software products from Synopsys, Inc. that can be used at this stage include iN-Phase, Proteus, and AFGen products.

Mask data preparation (stage 930): This provides the "tapeout" data for production of masks for lithographic use to produce finished chips. Exemplary EDA software products from Synopsys, Inc. that can be used at this include the CATS(R) family of products. Actual circuitry in the real world is created after this stage, in a wafer fabrication facility (also called "fab").

The data structures and software code (a plurality of instructions) for implementing one or more acts described in this detailed description (e.g. see FIGS. 2 and 4) can be encoded into a computer-readable medium, which may be any storage medium and/or any transmission medium that can hold code and/or data for use by a computer. Storage medium includes, but is not limited to, magnetic and optical storage devices such as disk drives, magnetic tape, CDs (compact discs), and DVDs (digital versatile discs). Transmission medium (with or without a carrier wave upon which the signals are modulated) includes but is not limited to a wired or wireless communications network, such as the Internet. In one embodiment, the transmission medium uses a carrier wave that includes computer instruction signals for carrying out one or more acts performed by the method illustrated in FIG. 2 and/or FIG. 4. In another embodiment, the transmission medium uses a carrier wave that includes instructions to perform the method illustrated in FIG. 2 and/or FIG. 4.

Note that a computer system used in some embodiments to implement an estimator 998 and a calibrator 999 of the type described herein uses one or more linux operating system workstations (based on IBM-compatible PCs) and/or unix operating systems workstations (e.g. SUN Ultrasparc, HP PA-RISC, or equivalent), each containing a 2 GHz CPU and 1 GB memory, that are interconnected via a local area network (Ethernet).

Numerous modifications and adaptations of the embodiments described herein will become apparent to the skilled artisan in view of this disclosure.

Figure 10:
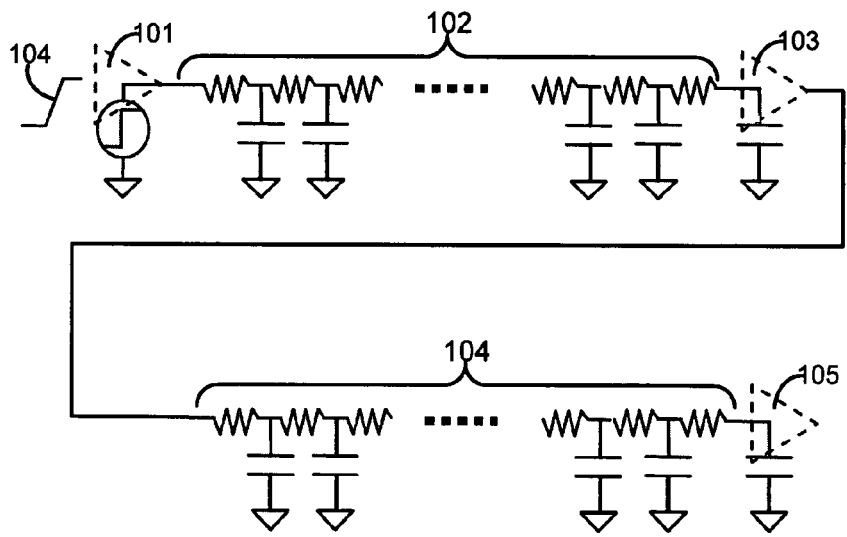
Figure 11:
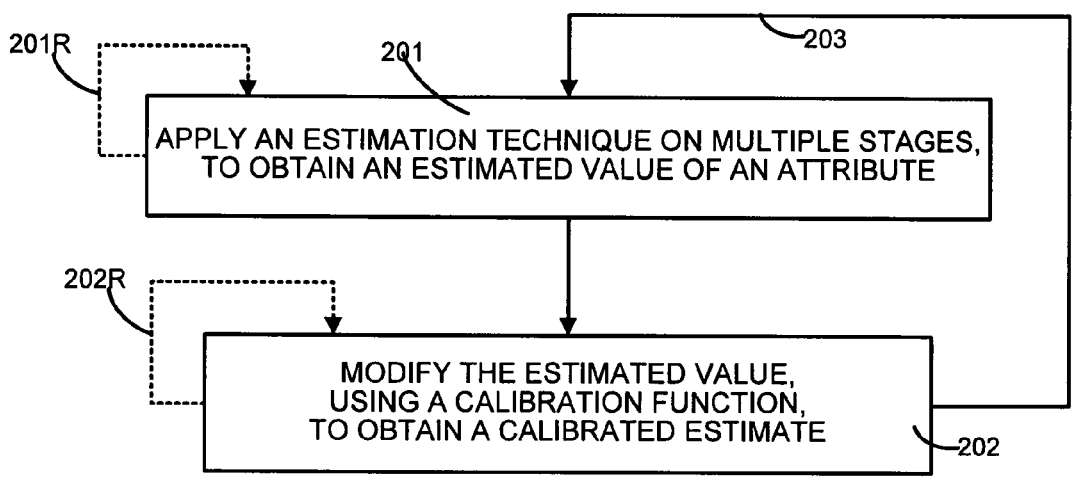
FIG. 11 illustrates a variant of the method of FIG. 2 applied to a circuit portion including a series of successive stages (e.g. a timing path).

For example, although computation of calibrated estimates has been discussed above, as values of attributes of a single stage in several embodiments, other embodiments compute and/or use calibrated estimates of attributes of multiple stages. A prior art circuit of multiple stages is illustrated in FIG. 10. Variation in attributes of such a multi-stage circuit are determined in some embodiments by computer 150 performing the above-described acts 201 and 202 as shown in FIG. 11, on a series of stages (such as the two stages in FIG. 10) which may be included in, for example, a timing path as determined by a timing analysis tool. A significant distinction between embodiments that perform the methods of FIGS. 2 and 11 is that FIG. 2 embodiments perform the method on a single stage, while FIG. 11 embodiments perform the method on multiple stages.

Moreover, methods of the type illustrated in FIGS. 2 and 4 are implemented in some embodiments in a computer-readable storage medium (such as a disk or a flash memory card) that is encoded with a plurality of instructions. Furthermore, methods of the type illustrated in FIGS. 2 and 4 are also implemented in certain embodiments in a bit string embodied in a transmission medium and encoded with a plurality of instructions. The just-described plurality of instructions are portions of software, which performs functionality of the type described herein.

Accordingly, numerous modifications and adaptations of the embodiments described herein are encompassed by the scope of the invention.

The following APPENDIX A is an integral part of this detailed description and is incorporated by reference herein in its entirety. This appendix provides further detailed description of an implementation of an illustrative embodiment of the type shown in FIG. 4.

APPENDIX A

In some embodiments, coefficients for parameteric elmore delay, given parasitic sensitivities, are computed by a computer that is programmed to perform the following steps A1 and A2.

STEP A1: If there are coupling capacitances, ground them by adding them to ground cap and adding the associated coefficients:

$C(1) = C(gN) + Agc_1 * \Delta v_1 + Agc_2 * \Delta v_2 + \ldots\ldots + Agc_N * \Delta v_n$ $Cc(1) = Cc(cN) + Acc_1 * \Delta v_1 + Acc_2 * \Delta v_2 + \ldots\ldots + Acc_N * \Delta v_n$

APPENDIX A-continued

New ground cap = $C(gN) + Cc(cN) + (Agc_1 + Acc_1) * \Delta v_1 + (Agc_2 + Acc_2) * \Delta v_1 + .... + (Agc_N + Acc_N) * \Delta v_1$ Now, the capacitances of all nodes of the net are given by:

$C(1) = C(1N) + A11 * \Delta v_1 + A21 * \Delta v_2 + ......... + An1 * \Delta v_n$
$C(2) = C(2N) + A12 * \Delta v_1 + A22 * \Delta v_2 + ......... + An2 * \Delta v_n$
............
$C(n) = C(nN) + A1n * \Delta v_1 + A2n * \Delta v_2 + ......... + Ann * \Delta v_n$ The resistances of the net are given by:

$R(1) = R(1N) + B11 * \Delta v_1 + B21 * \Delta v_2 + ......... + Bn1 * \Delta v_n$
$R(2) = R(2N) + B12 * \Delta v_1 + B22 * \Delta v_2 + ......... + Bn2 * \Delta v_n$
............
$R(n) = R(nN) + B1n * \Delta v_1 + B2n * \Delta v_2 + ......... + Bnn * \Delta v_n$

STEP A2:

Elmore delay of a net is given by $\Sigma_k R_{ke} * C_k$

Hence, it involves multiplication of resistances and capacitances and addition of such terms. Addition is simple, we just add the corresponding coefficients for variation parameters as shown above for coupling capacitances. To illustrate how to obtain the coefficients for multiplication, we multiply $R(1)$ and $C(1)$ given above (note that this is obtained by ignoring the affects of quadratic terms because the $\Delta v_i$ is small):

$R(1) * C(1) = (R(1N) + B11 * \Delta v_1 + B21 * \Delta v_2 + ......... + Bn1 * \Delta v_n) *$
$\qquad (C(1N) + A11 * \Delta v_1 + A21 * \Delta v_2 + ......... + An1 * \Delta v_n)$
$\qquad = R(1N) * C(1N) + (C(1N) * B11 + R(1N) * A11) * \Delta v_1$
$\qquad + (C(1N) * B21 + R(1N) * A21) * \Delta v_2 + ......... +$
$\qquad (C(1N) * Bn1 + R(1N) * An1) * \Delta v_n$

}

What is claimed is:

1. A computer-implemented method of determining variation in attributes in a design of an integrated circuit, the method comprising:

repeatedly applying an estimation technique to each of a plurality of values of at least one variation parameter affected by fabrication of the integrated circuit, to obtain a corresponding plurality of estimated values, of a design attribute of at least one stage in said design;

repeatedly performing on each estimated value, a calibration function, to obtain a plurality of calibrated estimates;

wherein the calibration function depends on at least a pair of initialization values of the design attribute derived from a predetermined sample, with one initialization value in the pair being obtained by applying said estimation technique and another initialization value in the pair being obtained by a predetermined method known to be more accurate than said estimation technique; and storing in memory the plurality of calibrated estimates.

2. The computer-implemented method of claim 1 wherein said storing is performed without computing any more values corresponding to said at least one variation parameter having the plurality of values.

3. The computer-implemented method of claim 1 wherein said design attribute is one of cell delay, cell slew, net delay and net slew.

4. The computer-implemented method of claim 1 further comprising:

supplying the plurality of calibrated estimates as inputs in performing said repeatedly applying and said repeatedly performing on another portion of the integrated circuit located downstream from said at least one stage in the design of the integrated circuit.

5. The computer-implemented method of claim 1 further comprising:

using the plurality of calibrated estimates, to determine a timing critical net.

6. The computer-implemented method of claim 1 wherein:

said calibration function comprises a ratio of said pair of initialization values to one another.

7. The computer-implemented method of claim 6 wherein:

said performing comprises multiplying each estimated value with said ratio.

8. The computer-implemented method of claim 1 wherein:

said design attribute is delay across a cell in the at least one stage; and the computer-implemented method further comprises using nominal delay of said cell to determine said calibration function.

9. A computer-implemented method of determining variation in attributes in a design of an integrated circuit, the method comprising:

repeatedly applying an estimation technique, by at least one computer, to each of a plurality of values of at least one variation parameter affected by fabrication of the integrated circuit, to obtain a corresponding plurality of estimated values, of a design attribute of at least one stage in said design;

repeatedly performing on each estimated value, a calibration function, to obtain a plurality of calibrated estimates;

wherein the calibration function depends on at least a pair of initialization values of the design attribute derived from a predetermined sample, with one initialization value in the pair being obtained by applying said estimation technique and another initialization value in the pair being obtained by a predetermined method known to be more accurate than said estimation technique; and storing the plurality of calibrated estimates;

wherein:

said design attribute is effective capacitance of the at least one stage; and said estimation technique computes total capacitance based on at least a capacitance of an interconnect in the at least one stage, and a capacitance of a cell in the at least one stage.

10. The computer-implemented method of claim 9 further comprising:

executing, based on cell delay as the design attribute, each of said acts of repeatedly applying the estimation technique and repeatedly performing the calibration function;

wherein during said executing, said repeatedly applying the estimation technique uses the plurality of calibrated estimates, of effective capacitance.

11. The computer-implemented method of claim 9 further comprising:

executing, based on cell slew as the design attribute, each of said acts of repeatedly applying the estimation technique and repeatedly performing the calibration function;

wherein during said executing, said repeatedly applying the estimation technique uses the plurality of calibrated estimates of effective capacitance.

12. The computer-implemented method of claim 9 further comprising:

executing, based on drive resistance as the design attribute, said act of repeatedly applying the estimation technique, with at least a plurality of calibrated estimates of cell slew as input.

13. The computer-implemented method of claim 9 further comprising:

executing, based on net delay as the design attribute, said act of repeatedly applying the estimation technique, with at least a plurality of calibrated estimates of drive resistance as input.

14. The computer-implemented method of claim 9 further comprising:
  executing, based on net slew as the design attribute, said act of repeatedly applying the estimation technique, with at least a plurality of calibrated estimates of net delay as input.

15. The computer-implemented method of claim 9 further comprising:
  using the plurality of calibrated estimates in statistical timing analysis.

16. The computer-implemented method of claim 9 further comprising:
  performing a multi point calibration to identify said calibration function.

17. A non-transitory computer-readable storage medium encoded with a plurality of instructions comprising:
  instructions to repeatedly apply an estimation technique to each of a plurality of values of at least one variation parameter affected by fabrication of the integrated circuit, to obtain a corresponding plurality of estimated values, of a design attribute of at least one stage in said design;
  instructions to repeatedly perform on each estimated value, a calibration function, to obtain a plurality of calibrated estimates;
  wherein the calibration function depends on at least a pair of initialization values of the design attribute derived from a predetermined sample, with one initialization value in the pair being obtained by applying said estimation technique and another initialization value in the pair being obtained by a predetermined method known to be more accurate than said estimation technique; and
  instructions to store the plurality of calibrated estimates;
  wherein:
  said design attribute is effective capacitance of the at least one stage; and
  said estimation technique computes total capacitance based on at least a capacitance of an interconnect in the at least one stage, and a capacitance of a cell in the at least one stage.

18. An apparatus comprising:
  a memory;
  means for repeatedly applying an estimation technique to each of a plurality of values of a variation parameter affected by fabrication of the integrated circuit, to obtain a corresponding plurality of estimated values, of a design attribute of at least one stage in said design;
  means for repeatedly performing on each estimated value, a calibration function, to obtain a plurality of calibrated estimates;
  wherein the calibration function depends on at least a pair of initialization values of the design attribute derived from a predetermined sample, with one initialization value in the pair being obtained by applying said estimation technique and another initialization value in the pair being obtained by a predetermined method known to be more accurate than said estimation technique; and
  means for storing in said memory the plurality of calibrated estimates.

* * * * *